US011508822B2

(12) United States Patent
Huang et al.

(10) Patent No.: US 11,508,822 B2
(45) Date of Patent: Nov. 22, 2022

(54) SOURCE/DRAIN VIA HAVING REDUCED RESISTANCE

(71) Applicant: Taiwan Semiconductor Manufacturing Co., Ltd., Hsin-Chu (TW)

(72) Inventors: Po-Yu Huang, Hsinchu (TW); Shih-Che Lin, Hsinchu (TW); Chao-Hsun Wang, Taoyuan County (TW); Kuo-Yi Chao, Hsinchu (TW); Mei-Yun Wang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 42 days.

(21) Appl. No.: 16/899,140

(22) Filed: Jun. 11, 2020

(65) Prior Publication Data

US 2021/0091190 A1   Mar. 25, 2021

Related U.S. Application Data

(60) Provisional application No. 62/905,850, filed on Sep. 25, 2019.

(51) Int. Cl.
| H01L 29/04 | (2006.01) |
| H01L 29/417 | (2006.01) |
| H01L 21/285 | (2006.01) |
| H01L 29/66 | (2006.01) |
| H01L 29/08 | (2006.01) |

(52) U.S. Cl.
CPC .. *H01L 29/41725* (2013.01); *H01L 21/28562* (2013.01); *H01L 29/0847* (2013.01); *H01L 29/66795* (2013.01)

(58) Field of Classification Search
None
See application file for complete search history.

(56) References Cited

U.S. PATENT DOCUMENTS

| 7,667,271 | B2 | 2/2010 | Yu et al. |
| 7,671,355 | B2 * | 3/2010 | Kuo ..................... H01L 45/126 365/100 |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |

(Continued)

*Primary Examiner* — Ali Naraghi
(74) *Attorney, Agent, or Firm* — Haynes and Boone, LLP

(57) ABSTRACT

A source/drain is disposed over a substrate. A source/drain contact is disposed over the source/drain. A first via is disposed over the source/drain contact. The first via has a laterally-protruding bottom portion and a top portion that is disposed over the laterally-protruding bottom portion.

20 Claims, 17 Drawing Sheets

(56) References Cited

U.S. PATENT DOCUMENTS

| | | | |
|---|---|---|---|
| 10,297,749 B1* | 5/2019 | Hashemi | H01L 45/1616 |
| 10,355,017 B1* | 7/2019 | Nakatsuji | H01L 21/302 |
| 2011/0248283 A1* | 10/2011 | Cao | H01L 29/42312 |
| | | | 257/E29.089 |
| 2014/0001574 A1 | 1/2014 | Chen et al. | |
| 2014/0035164 A1* | 2/2014 | Moon | H01L 23/481 |
| | | | 257/774 |
| 2014/0110755 A1 | 4/2014 | Colinge | |
| 2014/0151812 A1 | 6/2014 | Liaw | |
| 2014/0217603 A1* | 8/2014 | Moon | H01L 23/481 |
| | | | 257/774 |
| 2018/0277486 A1* | 9/2018 | Hasegawa | H01L 21/76804 |
| 2019/0355672 A1* | 11/2019 | Fujita | H01L 23/564 |

\* cited by examiner

SOURCE/DRAIN VIA HAVING REDUCED RESISTANCE

PRIORITY DATA

The present application is a utility application of provisional U.S. patent application 62/905,850, filed on Sep. 25, 2019, entitled "Multi-Step Metal-Fill for Contact Via", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the source/drain vias become smaller with each technology generation, electrical resistance attributed to the source/drain vias may increase. Such an increase in electrical resistance is undesirable since it may degrade device performance such as speed. Therefore, although conventional methods of forming source/drain vias have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
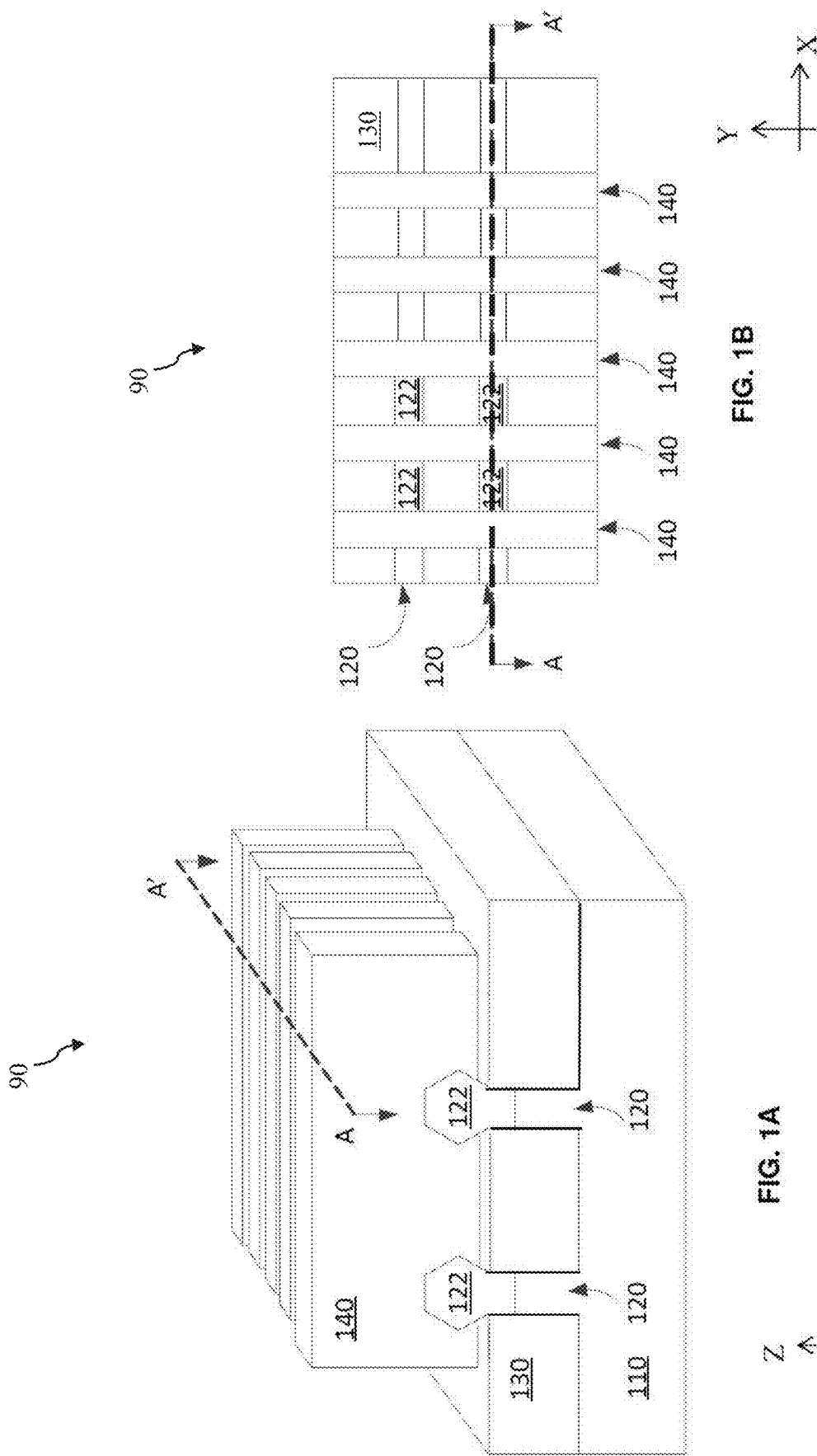
FIG. 1A is a perspective view of an IC device according to various aspects of the present disclosure.
FIG. 1B is a planar top view of an IC device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-line FETs (FinFETs). One aspect of the present disclosure involves forming source/drain vias having reduced resistance as a part of semiconductor device fabrication. For example, conventional methods of forming source/drain vias may need to first form a glue layer in a source/drain via hole, and then form the source/drain via on the glue layer to fill the via hole. This is because if the source/drain via had been deposited directly in the via hole without using the glue layer, the source/drain via may not have strong adhesion to the surrounding materials (e.g., dielectric materials) on which it is formed. The lack of adhesion may result in the source/drain via being peeled off during a polishing process performed later. However, although the presence of the glue layer may reduce the peeling of the source/drain via, it may substantially increase the overall electrical resistance of the source/drain via, since the glue layer may have a high electrical resistance compared to the material of the source/drain via. Such a high resistance is undesirable since it may adversely impact device performance, for example speed.

To overcome the problems discussed above, the present disclosure forms source/drain vias without using glue layers. For example, the source/drain via may be formed directly on a source/drain contact using a selective metal growth technique, which allows the source/drain via to have good adhesion to the source/drain contact. The source/drain via is also formed to have a laterally protruding bottom segment, which may offer various benefits such as reduced resistance, preventing corrosion caused by slurry, etc, as discussed below in more detail.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, though the IC device 90 as illustrated is a three-dimensional FinFET device, the concepts of the present disclosure may also apply to planar FET devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fins 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fins 120. The source/drain features 122 may include epi-layers that are epitaxially grown on the fin structures 120.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fins 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fins 120, a capping layer, other suitable layers, or combinations thereof.

Referring to FIG. 1B, multiple fins 120 are oriented lengthwise along the X-direction, and multiple gate structure 140 are oriented lengthwise along the Y-direction, i.e., generally perpendicular to the fins 120. In many embodiments, the IC device 90 includes additional features such as gate spacers disposed along sidewalls of the gate structures 140, hard mask layer(s) disposed over the gate structures 140, and numerous other features. For purpose of simplicity, the processing steps of the present disclosure are described in one embodiment with reference to cross-sectional views corresponding to FIGS. 2-12, where the cross-section of the IC device 90 is taken along the dashed line AA' as illustrated in FIGS. 1A-1B.

Figure 2:
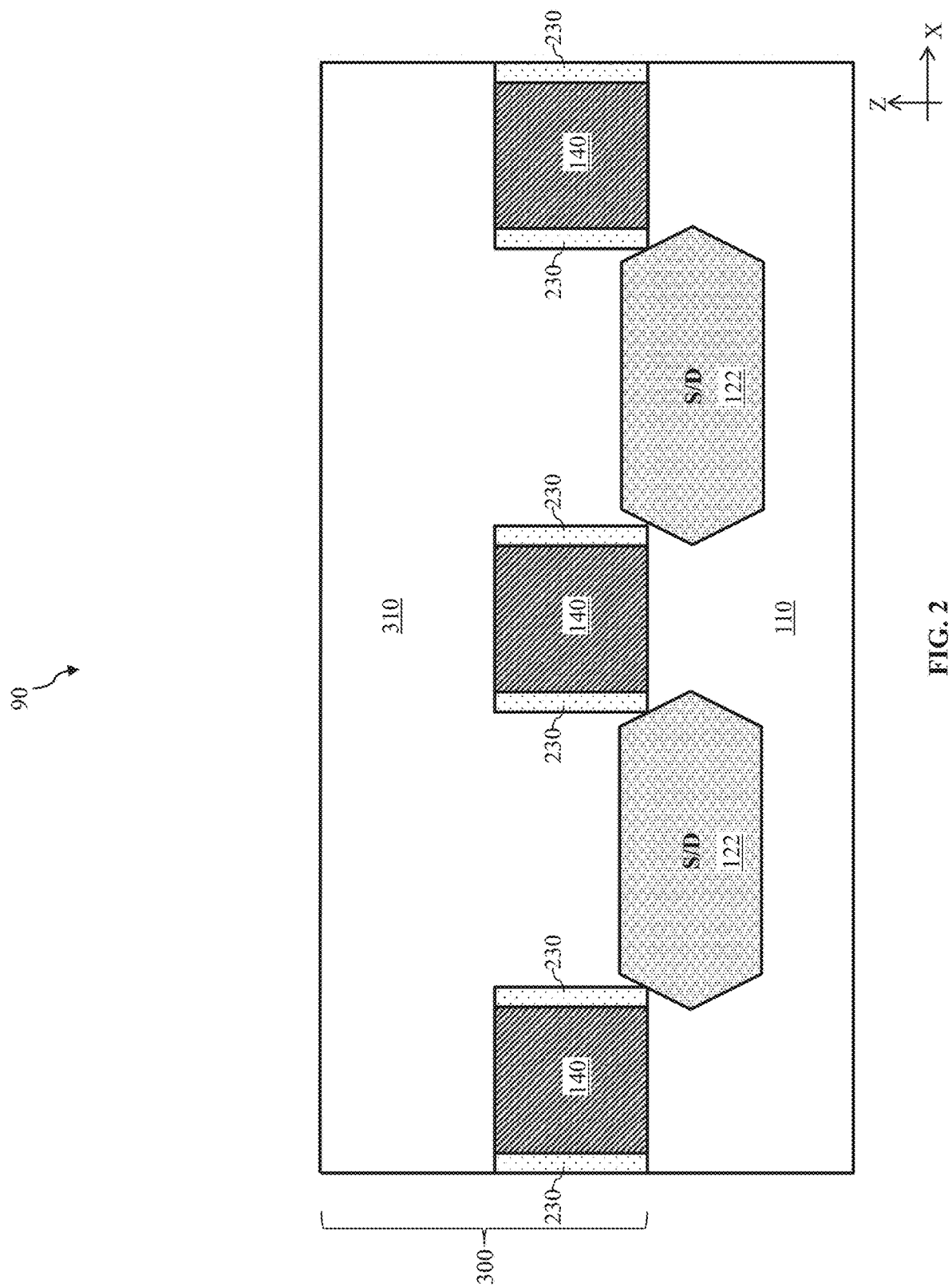
FIGS. 2-14 are cross-sectional views of various embodiments of an IC device at various stages of fabrication according to various aspects of the present disclosure.

Referring now to FIG. 2, the IC device 90 includes the substrate 110 discussed above. The gate structures 140 are formed over the substrate 110 in the Z-direction that is orthogonal to the horizontal plane defined by the X-direction and Y-direction. The gate structures 140 each interpose a source region and a drain region, where a channel region is defined in substrate 110 between the source region and the drain region. Gate structures 140 engage the channel regions, such that current can flow between the source/drain regions during operation. In some implementations, gate structures 140 are formed over fin structures (e.g., the fin structures 120 of FIGS. 1A-1B), such that the gate structures 140 each wrap a portion of the fin structures. For example, the gate structures 140 wrap channel regions of the fin structures, thereby interposing source regions and drain regions of the fin structure.

In some embodiments, the gate structures 140 include metal gate (MG) stacks, which are configured to achieve desired functionality according to design requirements. For example, the metal gate stacks may each include a gate dielectric and a gate electrode. The gate dielectric is disposed on the substrate 110, and the gate electrode is disposed on the gate dielectric. In some implementations, the gate dielectric is conformally disposed on sidewall surfaces and bottom surfaces of the IC device 90 defining the metal gate stacks, such that the gate dielectric is generally U-shaped and has a substantially uniform thickness. The gate dielectric may include a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof.

The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents and/or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride (W2N), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

The gate structures 140 may be fabricated according to a gate replacement process, which may be a gate-last process or a high-k-last process. For example, in a gate replacement process, dummy gate stacks are formed first and are subsequently replaced with the gate structures 140. The dummy gate stacks include, for example, an interfacial layer (including, for example, silicon oxide) and a dummy gate electrode layer (including, for example, polysilicon). The removal of the dummy gate electrode forms openings (trenches) that are subsequently filled by the metal gate electrodes of the gate structures 140. In some implementations, the dummy gate stacks are formed before forming an interlayer dielectric layer, and the dummy gate stacks are replaced with the gate structures 140 after forming the interlayer dielectric layer.

Gate-last processes and/or gate-first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof.

Still referring to FIG. 2, gate spacers 230 may be formed adjacent to the gate structures 140, for example on the sidewalls of the gate structures 140 in the X-direction. The gate spacers 230 may be formed by depositing a dielectric material and patterning the dielectric material. The deposited dielectric material may include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and subsequently anisotropically etched to form the gate spacers 230. In some implementations, gate spacers 230 may include a multi-layer structure, such as a first dielectric layer that includes silicon nitride and a second dielectric layer that includes silicon oxide. In some implementations, the gate spacers 230 may include more than one set of spacers, such as seal spacers, offset spacers, sacrificial spacers, dummy spacers, and/or main spacers, formed adjacent to the gate structures 140. In such implementations, the various sets of spacers can include materials having different etch rates. For example, a first dielectric layer including silicon and oxygen can be deposited over substrate 110 and subsequently anisotropically etched to form a first spacer set adjacent to gate stacks, and a second dielectric layer including silicon and nitrogen can be deposited over substrate 110 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown in FIG. 2) in source/drain (S/D) regions before and/or after forming gate spacers 126A, 126B.

Still referring to FIG. 2, the source/drain features 122 are formed in the source/drain regions of the substrate 210. In some embodiments, the source/drain features 122 may be formed using epitaxial processes. For example, a semiconductor material is epitaxially grown on the substrate 110, thereby forming the source/drain features 122 as epitaxially-grown structures. In the depicted embodiment, the gate structures 140 interpose respective source/drain features 122, and respective channel regions are defined in substrate 110 between respective epitaxial source/drain features 122 underneath respective gate structures 140. The IC device 90 can thus be configured to include transistors that includes gate structures 140 and their corresponding source/drain features 122 and channel regions. In some implementations, the source/drain features 122 wrap source/drain regions of the fin structures (e.g., the fin structures 120 of FIGS. 1A-1B), extending from substrate 110, such that the transistors are configured as FinFETs.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 110. The source/drain features 122 are doped with n-type dopants and/or p-type dopants. In some implementations, where a transistor is configured as an n-type device, the source/drain features 122 can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device, the source/drain features 122 can be silicon-and-germanium-containing epitaxial layers doped with boron, other p-type dopant, or combinations thereof (for example, forming Si:Ge:B epitaxial layers). In some implementations, the source/drain features 122 include materials and/or dopants that achieve desired tensile stress and/or compressive stress in the channel region. In some implementations, the source/drain features 122 are doped during deposition by adding impurities to a source material of the epitaxy process. In some implementations, the source/drain features 122 are doped by an ion implantation process after a deposition process. In some implementations, annealing processes are performed to activate dopants in the source/drain features 122 and/or other source/drain regions of the IC device 90.

Isolation feature(s) (not shown) may also be formed over and/or in substrate 110 to isolate various regions of the IC device 90. For example, isolation features define and electrically isolate active device regions and/or passive device regions from each other. In some implementations, an isolation feature can be configured to isolate transistors corresponding with the gate structures 140 and the source/drain features 122 from other transistors, devices, and/or regions of the IC device 90. Isolation features include an isolation material, such as silicon oxide, silicon nitride, silicon oxynitride, other suitable isolation material (for example, including silicon, oxygen, nitrogen, carbon, and/or other suitable isolation constituent), or combinations thereof. Isolation features can include different structures, such as shallow trench isolation (STI) structures, deep trench isolation (DTI) structures, and/or local oxidation of silicon (LOCOS) structures.

In some implementations, STI features can be formed by etching trenches in substrate 110 (for example, by using a dry etch process and/or wet etch process) and filling the trenches with insulator material (for example, by using a chemical vapor deposition process or a spin-on glass process). A chemical mechanical polishing (CMP) process may be performed to remove excessive insulator material and/or planarize a top surface of the STI features. In some implementations, STI features can be formed by depositing an insulator material over substrate 110 after forming fins, such that the insulator material layer fills gaps (trenches) between fin structures, and then etching back the insulator material layer. In some implementations, isolation features include multilayer structures that fill trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features include a dielectric layer disposed over a doped liner layer (including, for example, boron silicate glass or phosphosilicate glass).

Still referring to FIG. 2, a multilayer interconnect (MLI) structure 300 is disposed over the substrate 110 in the Z-direction. The MLI structure 300 electrically couples together various devices (for example, transistors, resistors, capacitors, and/or inductors) and/or components (for example, gate structures and/or source/drain features) of the IC device 90, such that the various devices and/or components operate as specified by design requirements of the IC device 90. The MLI structure 300 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines. Vertical interconnect features typically connect horizontal interconnect features in different layers (or different planes) of the MLI structure 300. During operation, the MLI structure 300 routes signals between the devices and/or the components of the IC device 90 and/or distribute signals (for example, clock signals, voltage signals, and/or ground signals) to the devices and/or the components of the IC device 90. Though the MLI structure 300 is depicted with a given number of dielectric layers and conductive layers, the present disclosure contemplates the MLI structure 300 having more dielectric layers and/or conductive layers or less dielectric layers and/or conductive layers.

At the stage of fabrication illustrated in FIG. 2, the MLI structure 300 includes an interlayer dielectric (ILD) layer 310 that is disposed over the substrate 110 and the gate structures 140 in the Z-direction and surrounds the gate structures 140 laterally, for example in the X-direction. In some embodiments, the ILD layer 310 may include a dielectric material, for example silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In some implementations, the ILD layer 310 can include a multilayer structure having multiple dielectric materials. The ILD layer 310 may be formed over the substrate 110 by a deposition process (such as CVD, PVD, ALD, HDPCVD, MOCVD, RPCVD, PECVD, LPCVD, ALCVD, APCVD, other suitable methods, or combinations thereof). In some implementations, the ILD layer 310 is formed by a flowable CVD (FCVD)

process that includes, for example, depositing a flow able material (such as a liquid compound) over the substrate 110 and converting the flowable material to a solid material by a suitable technique, such as thermal annealing and/or ultraviolet radiation treating. Subsequent to the deposition of the ILD layer 310, one or more CMP process and/or other planarization process may be performed, such that ILD layer 310 has a substantially planar upper surface.

Figure 3:
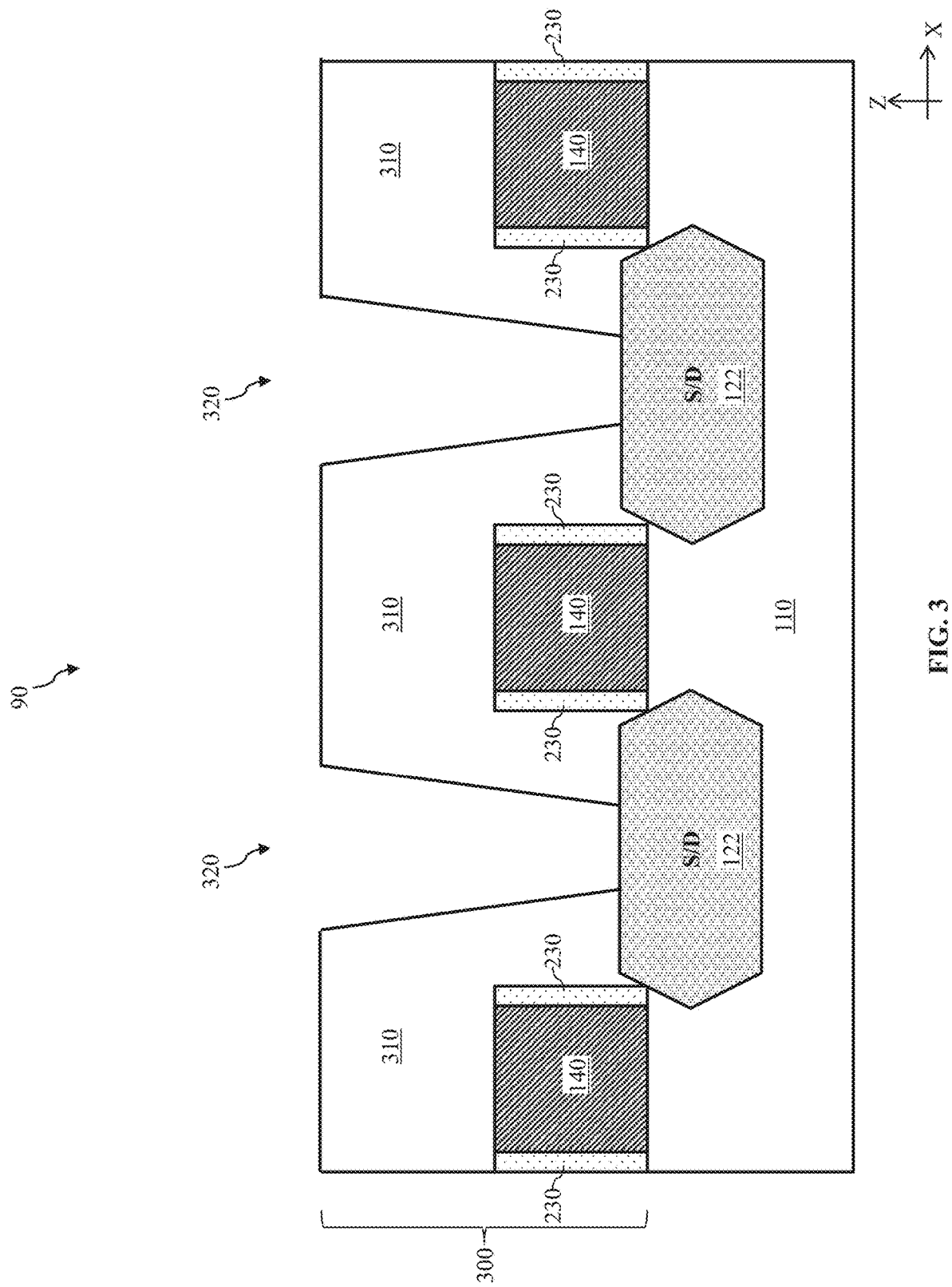

Referring now to FIG. 3, contact-trenches 320 may be formed, for example using one or more etching processes. The one or more etching processes may etch portions of the ILD layer 310 that are disposed over the source/drain features 122 until the source/drain features 122 are at least partially exposed. In other words, the contact-trenches 320 each extends vertically through the ILD layer 310 in the Z-direction.

Figure 4:
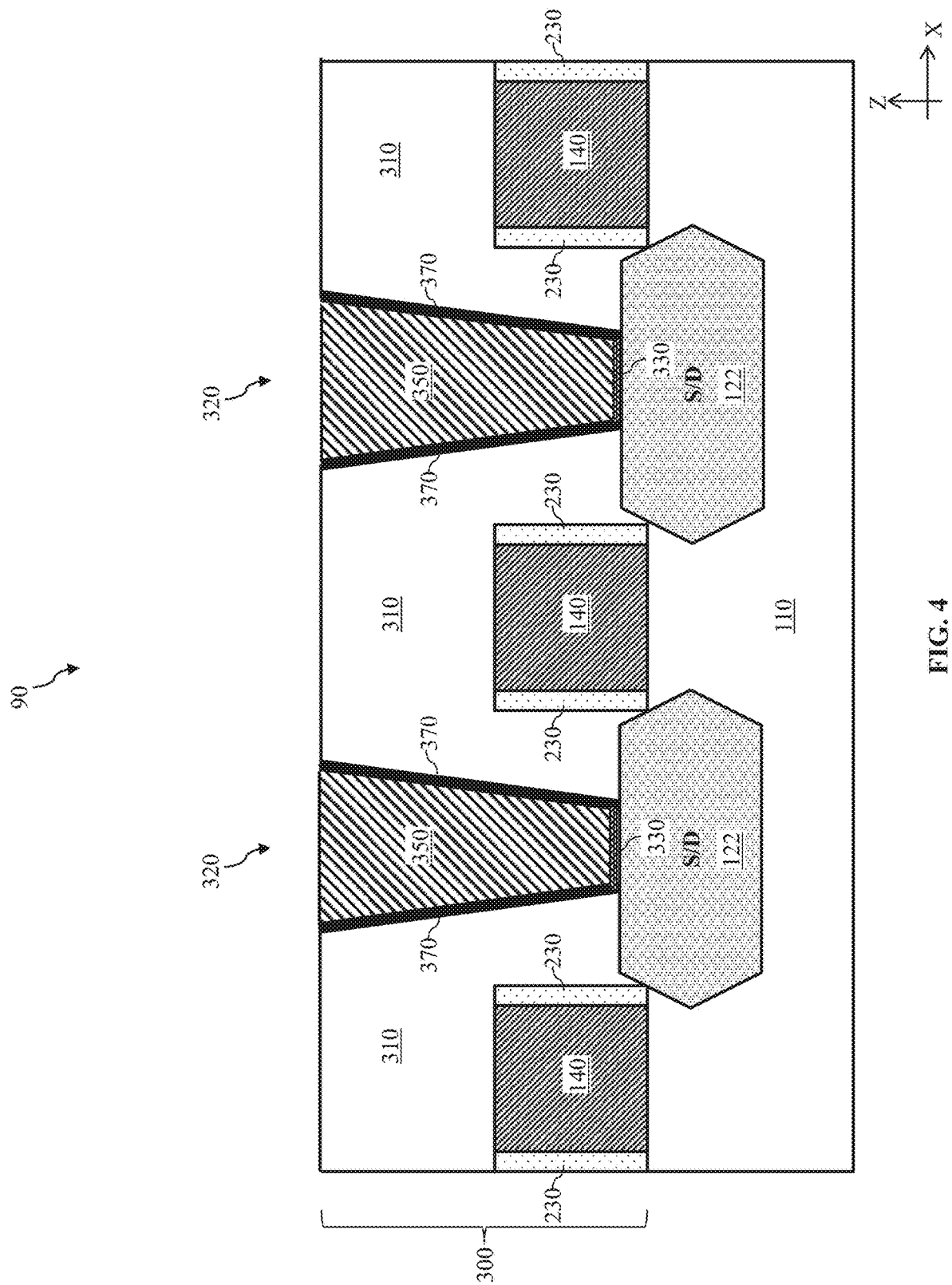

Referring now to FIG. 4, metal silicides 330 may be formed in the contact-trenches 320 on the exposed upper surfaces of the source/drain features 122. In some embodiments, the metal silicides 330 may be formed by depositing a layer of metal material (such as titanium or nickel) on the exposed upper surfaces of the source/drain features 122 and then performing an annealing process to cause the deposited metal material to react with the silicon-containing material of the source/drain features 122. The metal silicides 330 are formed as a result of the reaction between the deposited metal material and the source/drain features 122. The metal silicides 330 have reduced electrical resistance compared to other components of the IC device 90.

Source/drain contacts 350 are formed in the contact-trenches 320. For example, a conductive material (e.g., a metal material) may be deposited in the contact-trenches 320 using a suitable deposition process such as CVD, PVD, ALD, or combinations thereof. In some embodiments, the deposited conductive material may include cobalt (Co). In other embodiments, deposited conductive material may include the tungsten (W), ruthenium (Ru). The deposited conductive material may completely fill the contact-trenches 320, and portions thereof may be deposited over the upper surfaces of the ILD layer 310. A planarization process such as a CMP process may be performed subsequently to remove the portions of the conductive material that are deposited outside the contact-trenches 320 (e.g., the portions deposited on the upper surfaces of the ILD layer 310) and to make the upper surfaces of the conductive material filling the contact-trenches 320 substantially co-planar with the upper surfaces of the ILD layer 310. The source/drain contacts 350 are formed by the remaining portions of the conductive material filling the contact-trenches 320. Due to their relatively low electrical resistance, the metal silicides 330 serve as suitable electrical interfaces between the source/drain contacts 350 and the source/drain features 122. Alternatively, the metal silicides 330 may be considered parts of the source/drain contacts 350 themselves.

In some embodiments such as the embodiment shown in FIG. 4, barrier layers 370 may be formed between the source/drain contacts 350 and the ILD layer 310. For example, the barrier layers 370 (which may include a material that promotes adhesion or reduces diffusion between adjacent layers) may be formed on the sidewalls of the ILD layer 310 (i.e., on sidewalls of the contact trenches 320), and then the source/drain contacts 350 are formed on the barrier layers 370. In some embodiments, the barrier layers 370 may include W, Al, Ta, Ti, Ni, Cu, Co, or the metal oxides or metal nitrides thereof.

Figure 5:
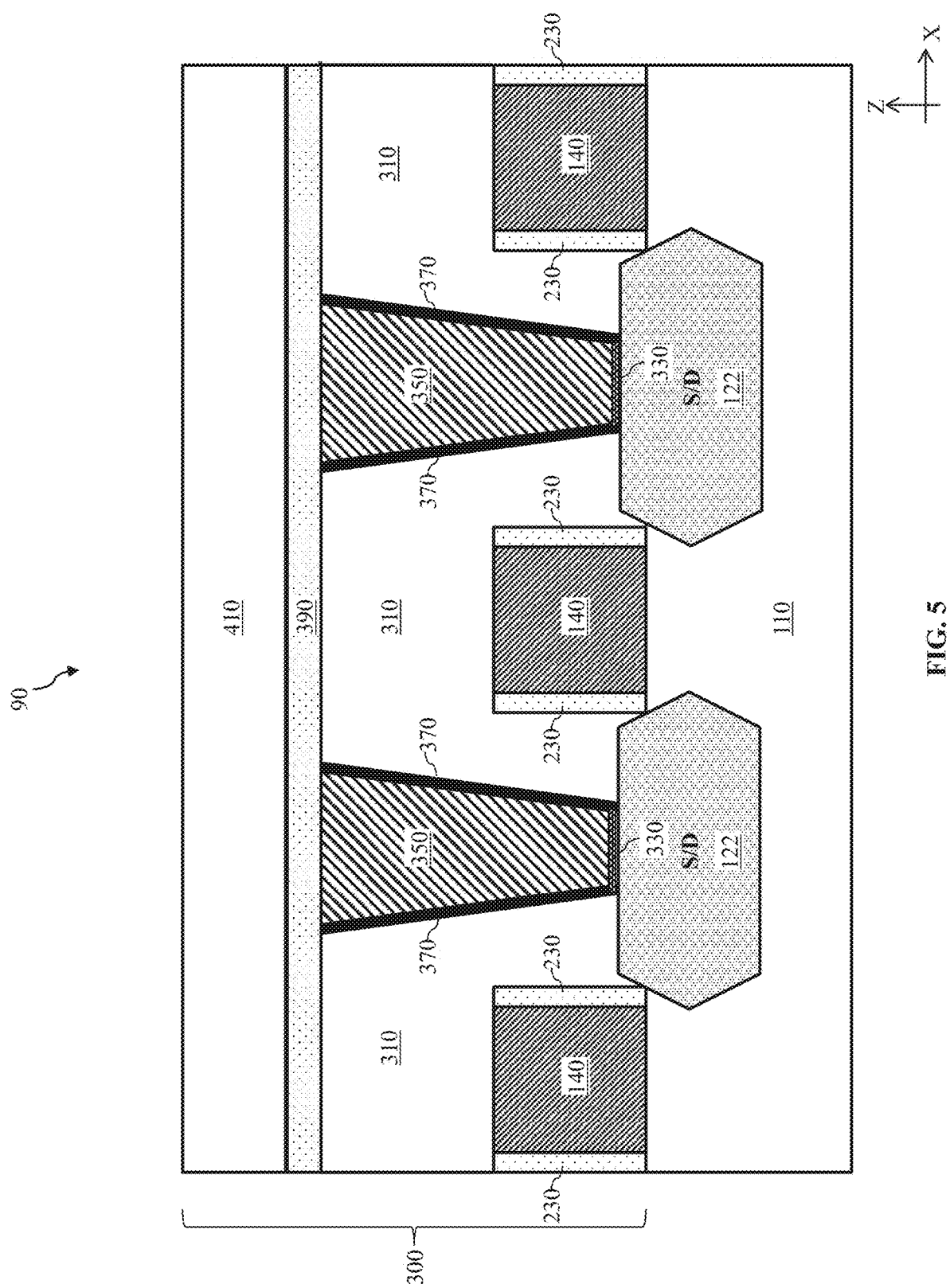

Referring now to FIG. 5, an etching-stop layer 390 is formed over the ILD layer 310 and over the source/drain contacts 350 in the Z-direction, and an ILD layer 410 is formed over the etching-stop layer 390 in the Z-direction. The etching-stop layer 390 and the ILD layer 410 may also be considered parts of the MLI 300. The etching-stop layer 390 and the ILD layer 410 may each be formed by a deposition process, such as CVD, PVD, ALD, HDPCVD, MOCVD, RPCVD, PECVD, LPCVD, ALCVD, APCVD, or combinations thereof. The material composition of the ILD layer 410 may be substantially similar to the material composition of the ILD layer 310.

In comparison, the material composition of the etching-stop layer 390 is configured to be different from the ILD layers 310 and 410, in order to help achieve etching selectivity between the etching-stop layer 390 and the ILD layers 310 or 410 during one or more etching processes. For example, the etching-stop layer 390 can be selectively etched relative to the ILD layers 310 and 410 (in other words, with no or minimal etching of the ILD layers 310 and 410), or vice versa. In various embodiments, the etching-stop layer 390 may include a dielectric material such as silicon oxide, silicon nitride, silicon oxynitride, silicon carbide, silicon oxycarbonitride, other suitable dielectric material (for example, including silicon, oxygen, nitrogen, carbon, and/or other suitable isolation constituent), or combinations thereof, so long as its material composition is different from that of the ILD layers 310 and 410. It is understood that a planarization process such as a CMP process may be performed to planarize the upper surface of the etching-stop layer 390 before the ILD layer 410 is formed, and another planarization process may be performed to planarize the upper surface of the ILD layer 410 after the ILD layer 410 is formed.

Figure 6:
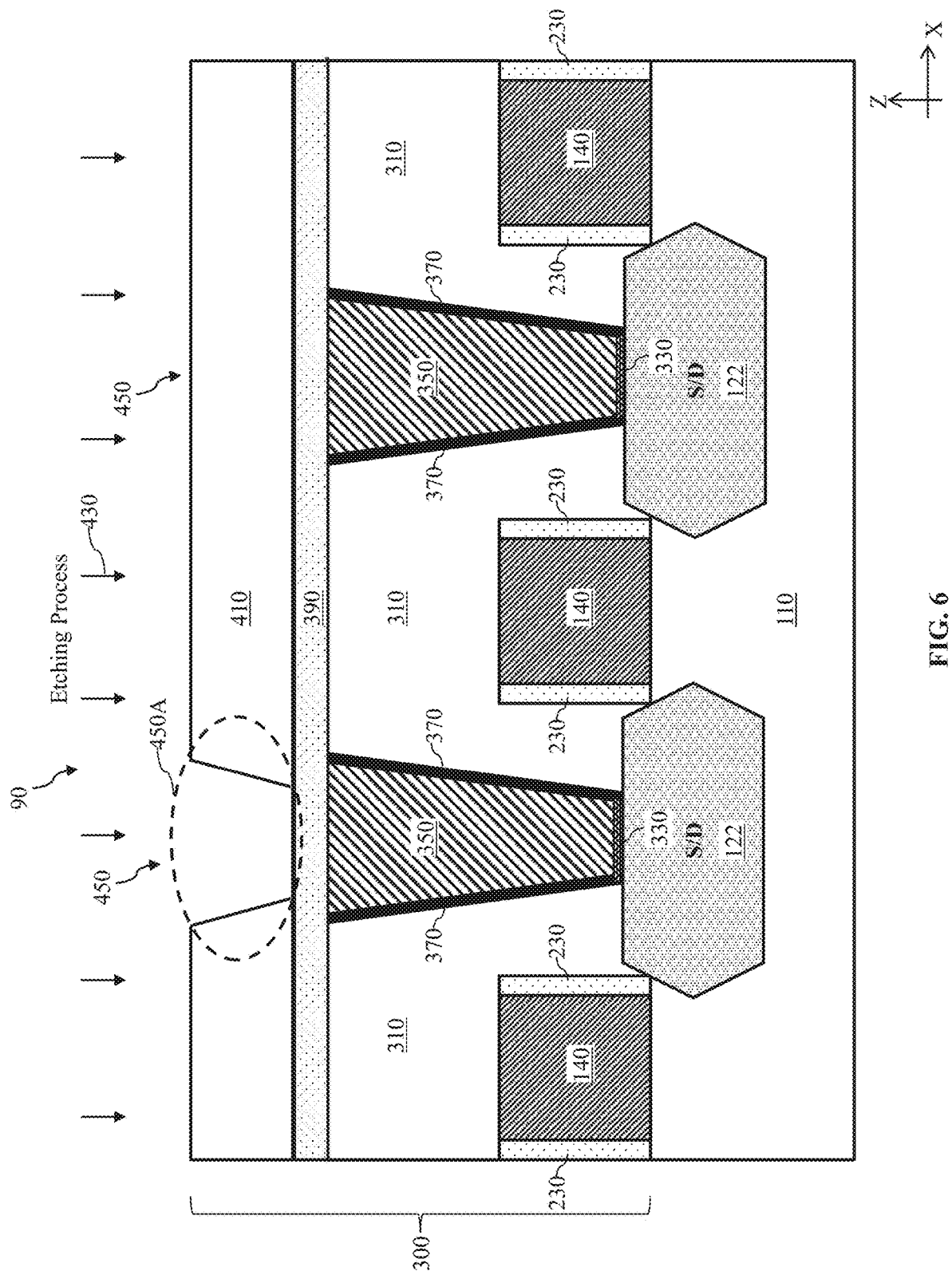

Referring now to FIG. 6, an etching process 430 is performed to the IC device 90 to etch a top portion 450A of a via-hole 450 into the ILD layer 410. The etching process 430 may include a dry etching process in some embodiments or a wet etching process in other embodiments. As discussed above, since the material compositions between the ILD layer 410 and the etching-stop layer 390 are different, the etching process 430 may be configured to have an etching selectivity between the ILD layer 410 and the etching-stop layer 390. In other words, the etching process 430 may etch away the ILD layer 410 at a substantially faster rate than the etching-stop layer 390. As a result, the etching process 430 may "stop" at the etching-stop layer 390, for example when the upper surface of the etching-stop layer 390 is reached. Note that the via-holes 450 are aligned with the source/drain contacts 350 in the X-direction. In subsequent processes, the via-holes 450 will be filled with a conductive material to form source/drain vias that provide electrical connectivity to the source/drain contacts 350.

Figure 7:
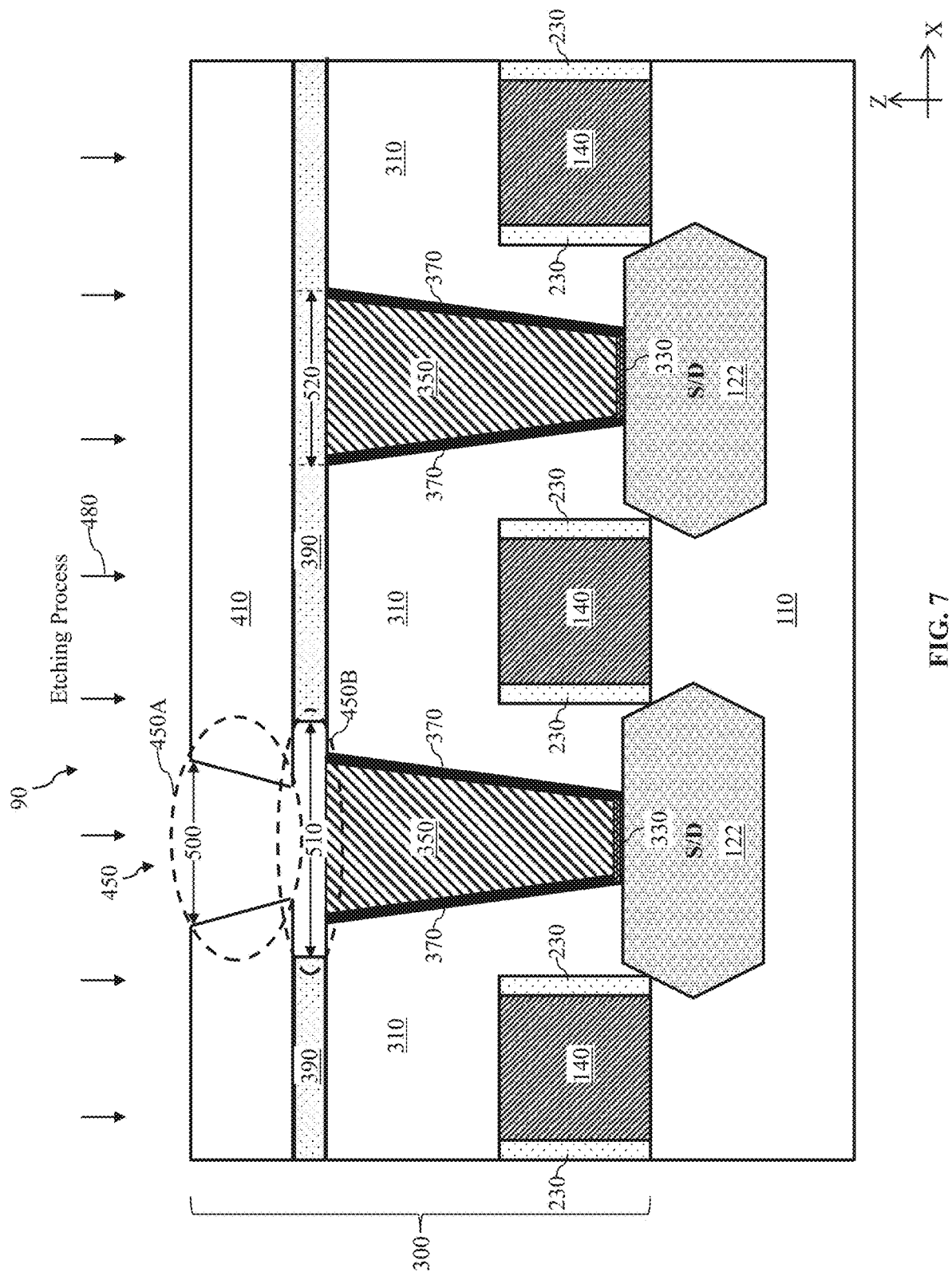

Referring now to FIG. 7, an etching process 480 is performed to the IC device 90 to etch a bottom portion 450B of the via-hole 450 into the etching-stop layer 390. Since the etching process 480 extends the via-holes 450 vertically downward (in the Z-direction) from the ILD layer 410 into the etching-stop layer 390, it may also be referred to as an etching-stop layer breakthrough process. The etching process 480 is also configured to have sufficient etching selectivity between the ILD layers 410/310 and the etching-stop layer 390, such that the etching-stop layer 390 is etched away without substantially affecting the ILD layers 410 or 310. In other words, the etching rate of the etching-stop layer 390 is substantially greater (e.g., more than 10 times) than the etching rate of the ILD layers 410 or 310. Similarly, the etching process 480 is also configured to have sufficient etching selectivity between the source/drain contact 350 and the etching-stop layer 390, such that the etching-stop layer 390 is etched away without substantially affecting the source/drain contact 350.

As shown in FIG. 7, one of the unique physical characteristics of the present disclosure is that the bottom portion 450B of the via-hole 450 may protrude laterally in the X-direction. In other words, rather than preserving/maintaining the tapered profile of the top portion 450A, the bottom portion 450B further expands laterally outward into the etching-stop layer 390, such that the bottom portion 450B is substantially wider than the top portion 450A in the X-direction, as well as wider than the source/drain contact 350 in the X-direction (though not necessarily wider than the source/drain contact 350 in the Y-direction).

For example, the top portion 450A may have a maximum lateral dimension 500 (e.g., at its widest opening) that is measured in the X-direction, the bottom portion 450B may have a maximum lateral dimension 510 that is measured in the X-direction, and the source/drain contact 350 may have a maximum lateral dimension 520 that is measured in the X-direction. For reasons of visual clarity (and to de-clutter FIG. 7), the maximum lateral dimension 520 of the source/drain contact 350 is labeled for the source/drain contact 350 that is to the "right" of the via-hole 450, rather than at the source/drain contact 350 directly beneath the via-hole 450, though it is understood that these two source/drain contacts 350 may have substantially similar dimensions. In any case, the etching process 480 is performed such that the maximum lateral dimension 510 of the bottom portion 450B of the via-hole 450 is substantially greater than the maximum lateral dimension 500 of the top portion 450A of the via-hole 450, and that the maximum lateral dimension 510 is also substantially greater than the maximum lateral dimension 520 of the source/drain contact 350 in the X-direction.

In some embodiments, the lateral protrusion of the bottom portion 450B of the via-hole 450 may be achieved by configuring the process duration of the etching process 480. For example, had the etching process 480 been performed with an etching process duration of X amount of time, it may allow the via-hole 450 to extend vertically through the etching-stop layer 390 but may not result in any lateral protrusion. Therefore, in order to achieve the lateral protrusion discussed above, the etching process 480 may be performed with an etching process duration that is substantially longer than the X amount of time. The extra etching time causes additional materials of the etching-stop layer 390 to be etched away, thereby expanding the bottom portion 450B laterally.

Meanwhile, due to the etching selectivity between the etching-stop layer 390 and the ILD layers 410/310 and the source/drain contact 350, the ILD layers 410/310 and the source/drain contact 350 are not affected (or at least minimally) by the extra etching time. In some embodiments, the etching process 480 is performed using an etching gas mixture of $CH_3F$, $CF_4$, and $H_2$, where the ratio of $CH_3F:CF_4$ is in a range from about 1:3 to about 3:1, and the ratio of $CF_4:H_2$ is in a range from about 1:50 and about 3:40, and the etching process 480 is performed with a process duration in a range between 20 seconds and 60 seconds. Again, as discussed above, the etching process duration is not randomly chosen but specifically configured to ensure that the bottom portion 450B of the via-hole 450 achieves the laterally protruding profile.

Alternatively, the etching process 480 may be performed in two steps, where a first step may be performed to "break through" the etching-stop layer 390 vertically, and a second step may be performed to achieve the lateral etching of the etching-stop layer 390. In some embodiments, the two steps may be performed using different etchants and/or different etching conditions.

Regardless of how the laterally protruding profile is achieved for the bottom portion 450B of the via-hole 450, such a profile is beneficial. One benefit is that such a profile reduces the electrical resistance of the source/drain via that is formed in the via-hole 450, since the lateral protrusion translates into a large via size or larger interface area between the via and the source/drain contact 350. The reduced electrical resistance may lead to faster speed of the IC device 90. As another benefit, such a laterally protruding profile allows the subsequently-formed source/drain via to prevent contamination to the source/drain contact 350 below, where the contamination comes from chemicals used in certain subsequent fabrication processes. For example, slurry used in subsequent CMP processes may corrode the source/drain contact 350 if the source/drain contact 350 is exposed to it. Here, the wide bottom portion of the source/drain via allows it to effectively serve as a blocker against the chemicals, which helps prevent damage to the source/drain contact 350.

Figure 8:
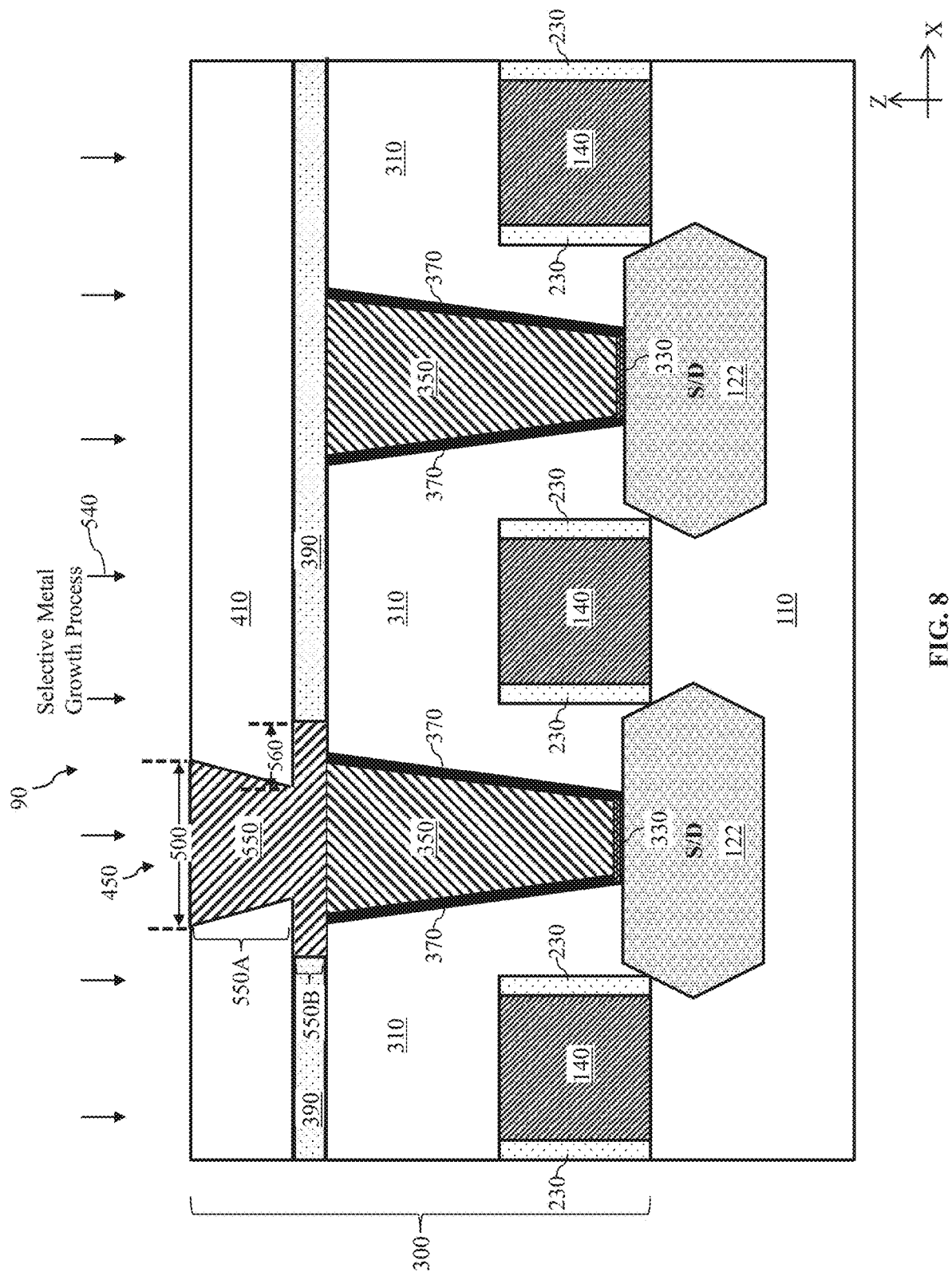

Referring now to FIG. 8, a selective metal growth process 540 is performed to the IC device 90 to form a source/drain via 550 in the via-hole 450. In some embodiments, the source/drain via 550 is formed to have a tungsten composition. In other embodiments, the source/drain via 550 may be formed to include ruthenium or cobalt. In some embodiments, the source/drain via 550 has a different material composition than the source/drain contact 350, which allows the source/drain via 550 to serve as a blocker against chemicals (e.g., CMP slurry) that could corrode the source/drain contacts 350.

Unlike other metal deposition processes where metal is deposited on various types of material surfaces (including on dielectric surfaces), the selective metal growth process 540 deposits the metal material on the upper surface of the source/drain contact 350 (which is a metallic surface) exposed by the via-hole 450, but not on the exposed surfaces of the ILD layers 410 or 310, nor on the exposed surfaces of the etching-stop layer 390. As such, the source/drain via 550 is formed in a "bottom-up" approach, where its bottom portion 550B is formed first on the source/drain contact 350, and then the top portion 550A is formed on the bottom portion 550B. The fact that the source/drain via 550 is grown directly on the source/drain contact 350 results in good adhesion therebetween, which makes the source/drain via 550 harder to be peeled off inadvertently in subsequent polishing processes.

In this manner described above, the source/drain via 550 can be formed without using a glue layer, unlike conventional processes. The absence of the glue layer herein means that the side surfaces of the bottom portion 550B of the source/drain via 550 are in direct physical contact with the side surfaces of the etching-stop layer 390, and that the side surfaces of the top portion 550A of the source/drain via 550 are in direct physical contact with the side surfaces of the ILD layer 410. In comparison, conventional fabrication processes would have implemented a glue layer between the source/drain via 550 and the ILD layer 410 and the etching-stop layer 390. As discussed above, the glue layer used in conventional processes may contribute to excessive electrical resistance. By eliminating such a glue layer in the formation of the source/drain via 550 herein, the present disclosure further reduces the resistance of the source/drain via 550, which in turns improves device performance such as speed.

In some embodiments, the selective metal growth process 540 is performed using a selective CVD technique. For example, using $WF_6$ or $WCl_5$ as a precursor gas, polycrystalline tungsten may be selectively deposited on the exposed upper surface of the source/drain contact 350 in the via-hole 450. The precursor gas may also be mixed with $H_2$ at a ratio of about 0.1% to about 1.5%. The selective CVD technique may be performed at a pressure in a range between about 1 Torr and about 50 Torr. The selective CVD technique may also be performed at a temperature in a range between about 200 degrees Celsius and about 400 degrees Celsius. These process parameters are not randomly chosen but are carefully configured to ensure the successful growth of the metal material (e.g., tungsten) of the source/drain via 550 on the source/drain contact 350 and with sufficient adhesion therebetween.

As discussed above and shown in FIG. 8, one of the distinctive physical characteristics of the device 90 is that the source/drain via 550 has the laterally-protruding bottom portion 550B. For example, the bottom portion 550B may protrude laterally outwards from the bottom part of the sidewall of the top portion 550A (e.g., where the top portion 550A adjoins the bottom portion 550B) by a distance 560. In some embodiments, a ratio between the distance 560 and the dimension 500 of the top portion is in a range from about 1:6 to about 1:10.

Figure 9:
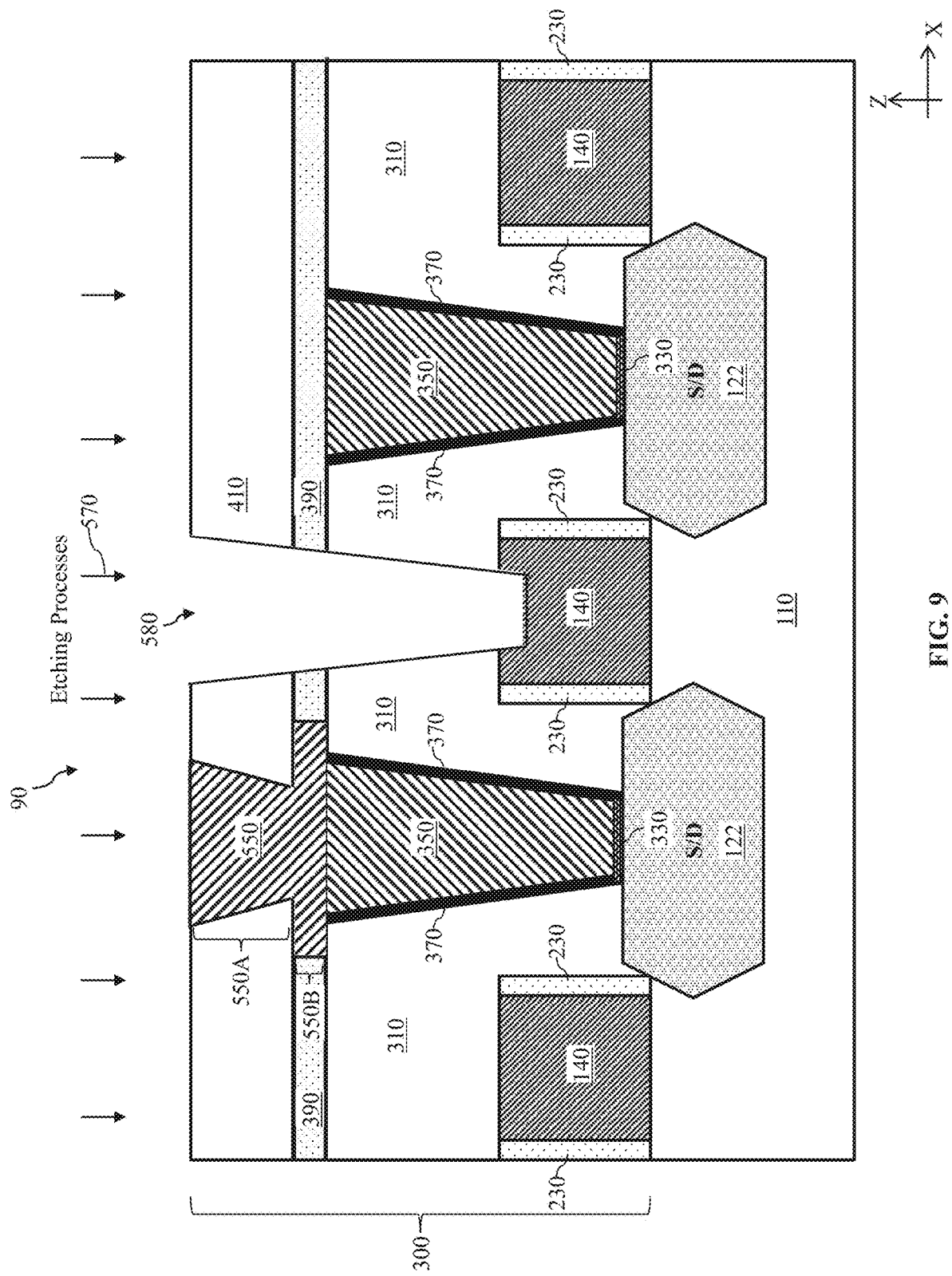

Referring now to FIG. 9, one or more etching processes 570 is performed to the IC device 90 to form a via-hole 580 over one of the gate structures 140 adjacent to the source/drain contact 350. The via-hole 580 extends vertically through the ILD layer 410, the etching-stop layer 390, and the ILD layer 310. The via-hole 580 may also extend partially into the gate structure 140. This is because the gate structure 140 may include one or more dielectric hard mask layers that are located above the gate electrode. For reasons of simplicity, the one or more dielectric hard mask layers and the gate electrode are not separately illustrated herein. The via-hole 580 is etched until the upper surface of the gate electrode is exposed, which means that the via-hole 580 extends through the one or more dielectric hard mask layers.

Figure 10:
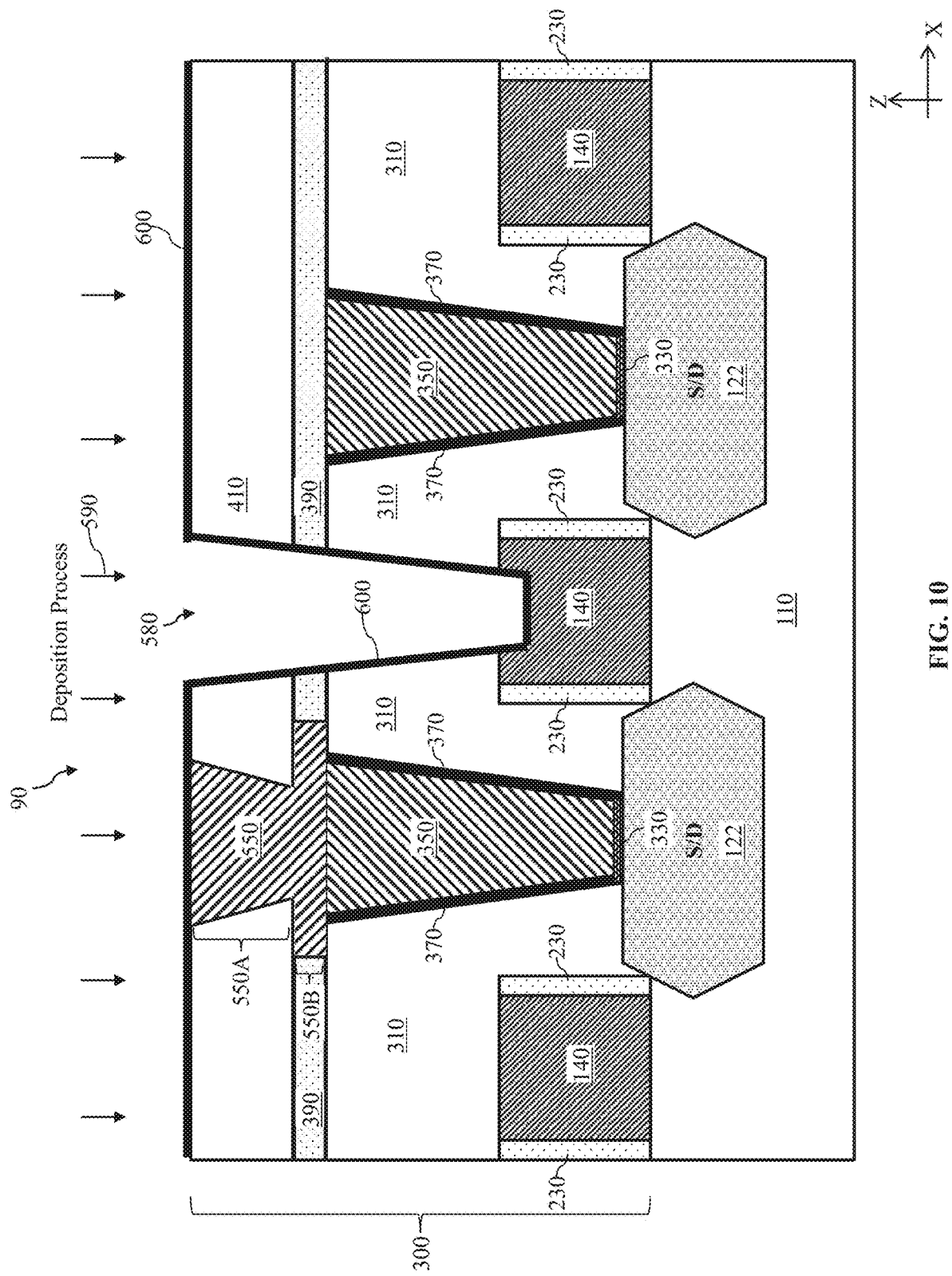

Referring now to FIG. 10, a deposition process 590 is performed to the IC device 90 to form a glue layer 600. The glue layer 600 is formed on the sidewalls and the bottom surface of the via-hole 580, as well as on the top surfaces of the ILD layer 410 and the source/drain via 550. In some embodiments, the glue layer 600 includes titanium, titanium nitride, or combinations thereof. The glue layer 600 may be formed for adhesion enhancement purposes. The glue layer 600 may also reduce the formation and/or accumulation of undesirable native oxides at the top surface of the gate structure 140.

Figure 11:
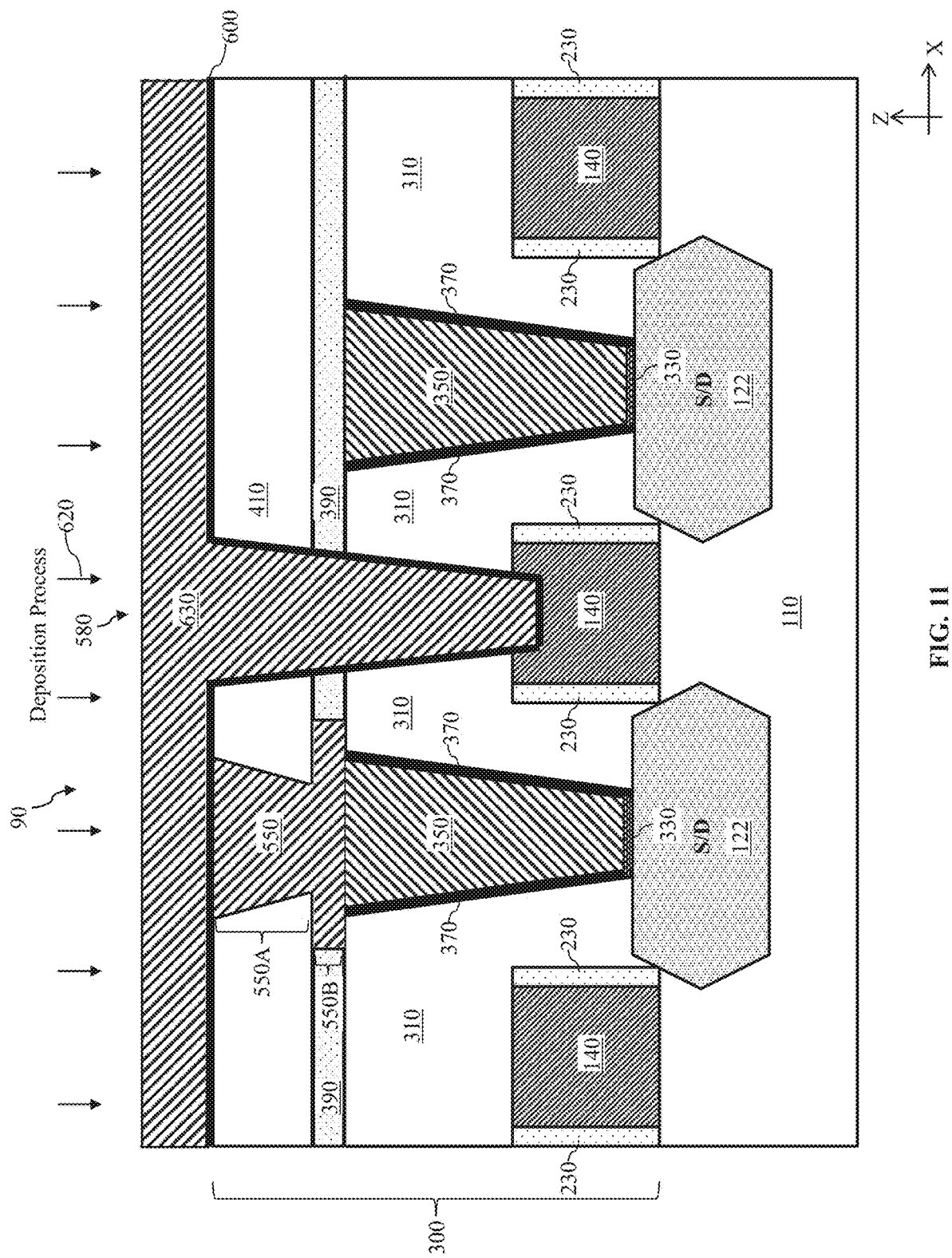

Referring now to FIG. 11, a deposition process 620 is performed to the IC device 90 to form a conductive layer 630 on the glue layer 600. In some embodiments, the conductive layer 630 includes tungsten, ruthenium, cobalt, or combinations thereof. The conductive layer 630 completely fills the via-hole 580.

Figure 12:
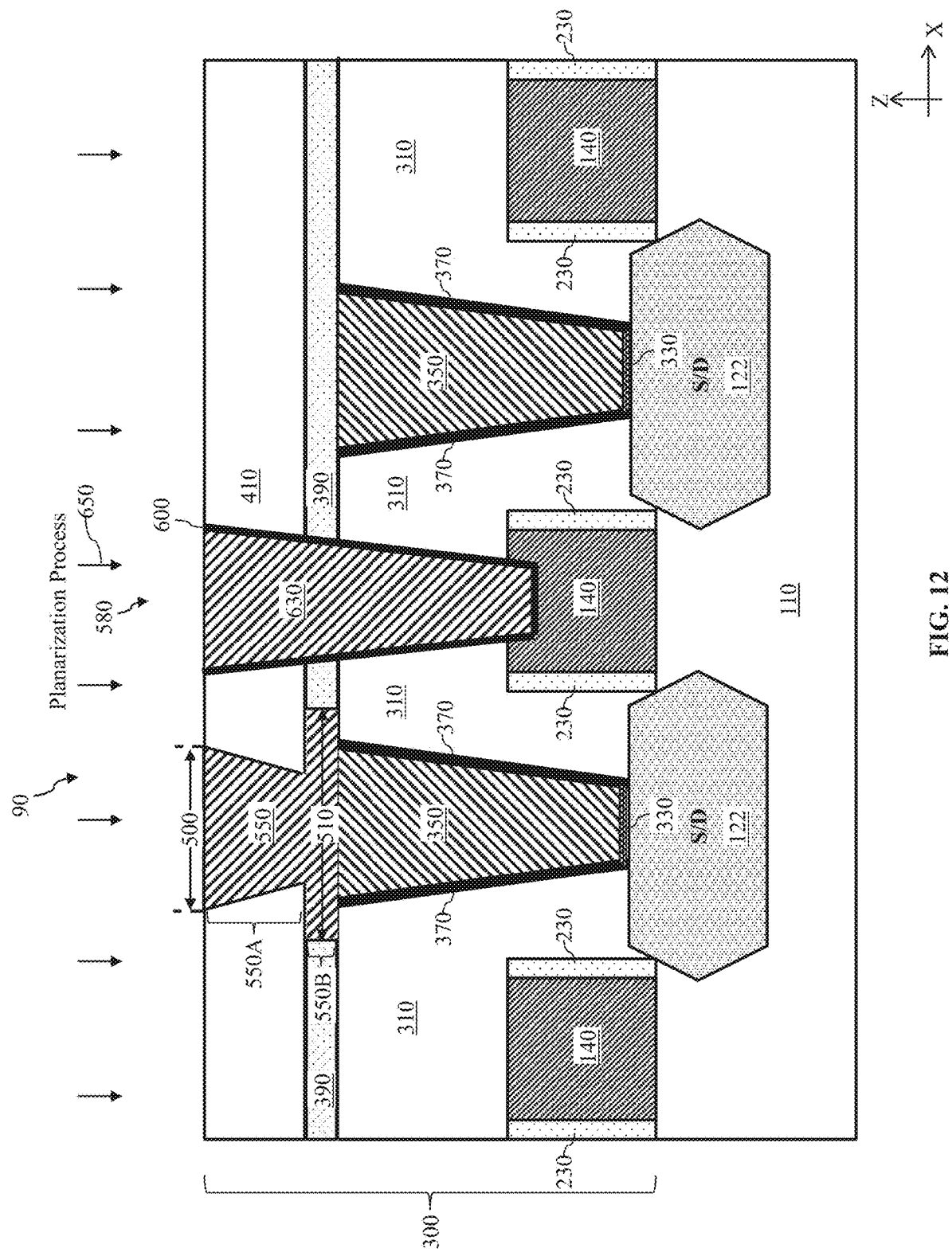

Referring now to FIG. 12, a planarization process 650 is performed to the IC device 90. For example, the planarization process 650 may include a CMP process, which may use an abrasive and/or corrosive chemical referred to as CMP slurry in conjunction with a polishing pad to polish the upper surfaces of the various layers of the IC device 90. The planarization process 650 is performed until the portions of the conductive layer 630 and the glue layer 600 that are outside of the via-hole 580 are removed. In other words, the planarization process 650 is performed until the upper surfaces of the ILD layer 410 and the source/drain via 550 become exposed. These upper surfaces are co-planar with the upper surface of the remaining portion of the conductive layer 630, which forms a gate via since it provides electrical connectivity to the gate structure 140 therebelow. The conductive layer 630 may hereinafter be interchangeably referred to as a gate via 630.

As discussed above, the slurry used in the planarization process 650 may contain chemicals having abrasive and/or corrosive properties. If the slurry comes in physical contact with the source/drain contact 350, the slurry may corrode the source/drain contact 350, particularly in embodiments where cobalt is used to implement the source/drain contact 350, because cobalt may be more prone to being damaged by the corrosive chemicals of the slurry. Here, the relatively wide bottom portion 550B of the source/drain via 550 covers up a greater amount of surface area of the source/drain contact 350, thereby serving as a "blocker" against the slurry. In many embodiments, the source/drain via 550 is implemented using tungsten, which is not as sensitive to the corrosive chemicals of the slurry as cobalt (e.g., used to implement the source/drain contact 350). As such, the unique design of the source/drain via 550 herein reduces the likelihood of the source/drain contact 350 being damaged by the slurry of the planarization process 650, which is one of the benefits of the via design of the present disclosure.

Another benefit of the source/drain via 550 herein is reduced resistance. As discussed above, by having a laterally protruding bottom portion 550B (e.g., having a greater dimension 510 than the dimension 500 of the top portion 550A), the source/drain via 550 herein has a large interface area with the source/drain contact 350. The large interface area results in reduced resistance. In addition, the elimination of the glue layer can also reduce the overall electrical resistance since the material of the glue layer has a greater resistivity than the material of the source/drain via 550.

As another benefit, since the source/drain via 550 is grown on the source/drain contact 350 using the selective metal growth process 540 (discussed above with reference to FIG. 8), the resulting source/drain via 550 has strong adhesion with the source/drain contact 350. Due to the strong adhesion, the polishing steps of the planarization process 650 are unlikely to be able to inadvertently peel off the source/drain via 550. Moreover, the laterally protruding bottom portion 550B may be "pinned" by the ILD layer 410, thereby making it more difficult for the source/drain via 550 to be inadvertently peeled off.

Figure 13:
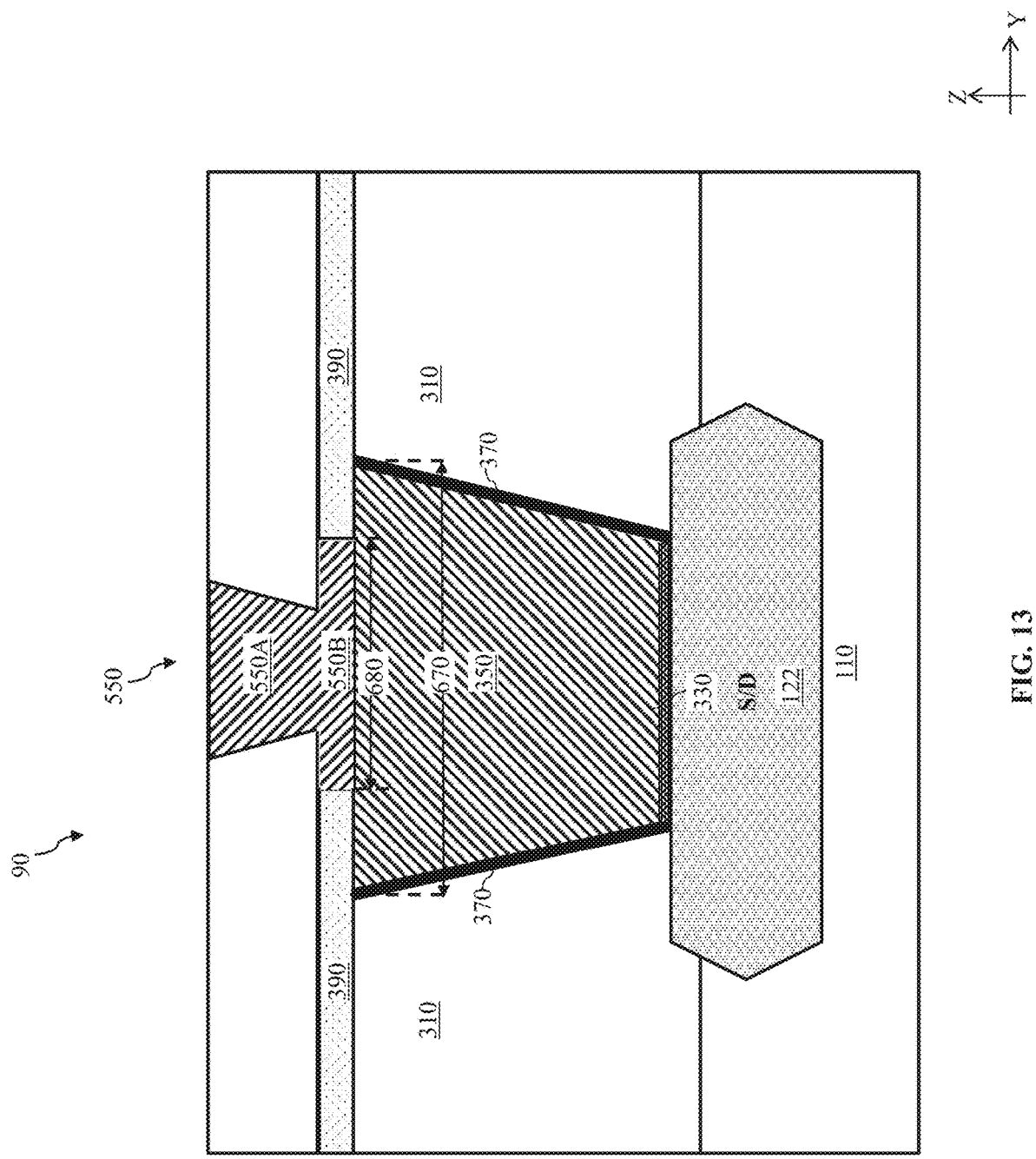

Another benefit of the source/drain via 550 of the present disclosure involves a more gradual transition, which is discussed below with reference to FIG. 13. In that regard, FIG. 13 is also a diagrammatic fragmentary cross-sectional side view of a portion of the IC device 90, except that the cross-section is taken at a Y-Z plane, as opposed to the X-Z plane as in FIGS. 2-12. In other words, whereas FIGS. 2-12 illustrate an X-cut cross-section, FIG. 13 illustrates a Y-cut cross-section.

Referring to FIG. 13, the source/drain via 550 is still formed over the source/drain contact 350 as discussed above. However, the source/drain contact 350 has a much larger lateral dimension in the Y-direction than in the X-direction. For example, the source/drain contact 350 has a maximum lateral dimension 670 in the Y-direction, which is substantially greater than its maximum dimension 520 in the X-direction (see FIG. 7). Meanwhile, the source/drain via 550 has a maximum lateral dimension 680 in the Y-direction, which as shown in FIG. 13 is smaller than the dimension 670. Note that the maximum dimension 680 may be a dimension of the top portion 550A or it may be a dimension of the bottom portion 550B. However, although the dimension 680 is smaller than the dimension 670, it is still a more gradual transition in size. In comparison, the bottom surface of conventional source/drain vias would be much smaller than the upper surface of the source/drain contact in the Y-direction, since conventional source/drain vias lack the laterally protruding bottom profile. As such, conventional schemes would have entailed a drastic change from a relatively wide source/drain contact to a very narrow source/drain via. Such a drastic size change is undesirable as it could lead to defects (e.g., broken vias) or other fabrication related difficulties. Here, since the bottom portion 550B of the source/drain via 550 is much wider than conventional source/drain vias, it allows a more gradual transition from the source/drain contact 350 to the source/drain via 550, which reduces potential defects or fabrication problems.

In the embodiments discussed above, the source/drain via 550 and the gate via 630 may be at least partially aligned laterally. In other words, at least a portion of the source/drain via 550 is located at the same X-Z cross-sectional plane as at least a portion of the gate via 630. However, this is not intended to be limiting. In other embodiments, the source/drain via 550 and the gate via 630 may be positionally offset in both the X-direction and the Y-direction. Such an embodiment is illustrated in FIGS. 14 and 15, where FIG. 14 is a diagrammatic fragmentary cross-sectional side view taken along the X-Z plane (similar to FIGS. 2-12), and FIG. 15 is a diagrammatic fragmentary top view of the alternative embodiment of the IC device 90.

Figure 14:
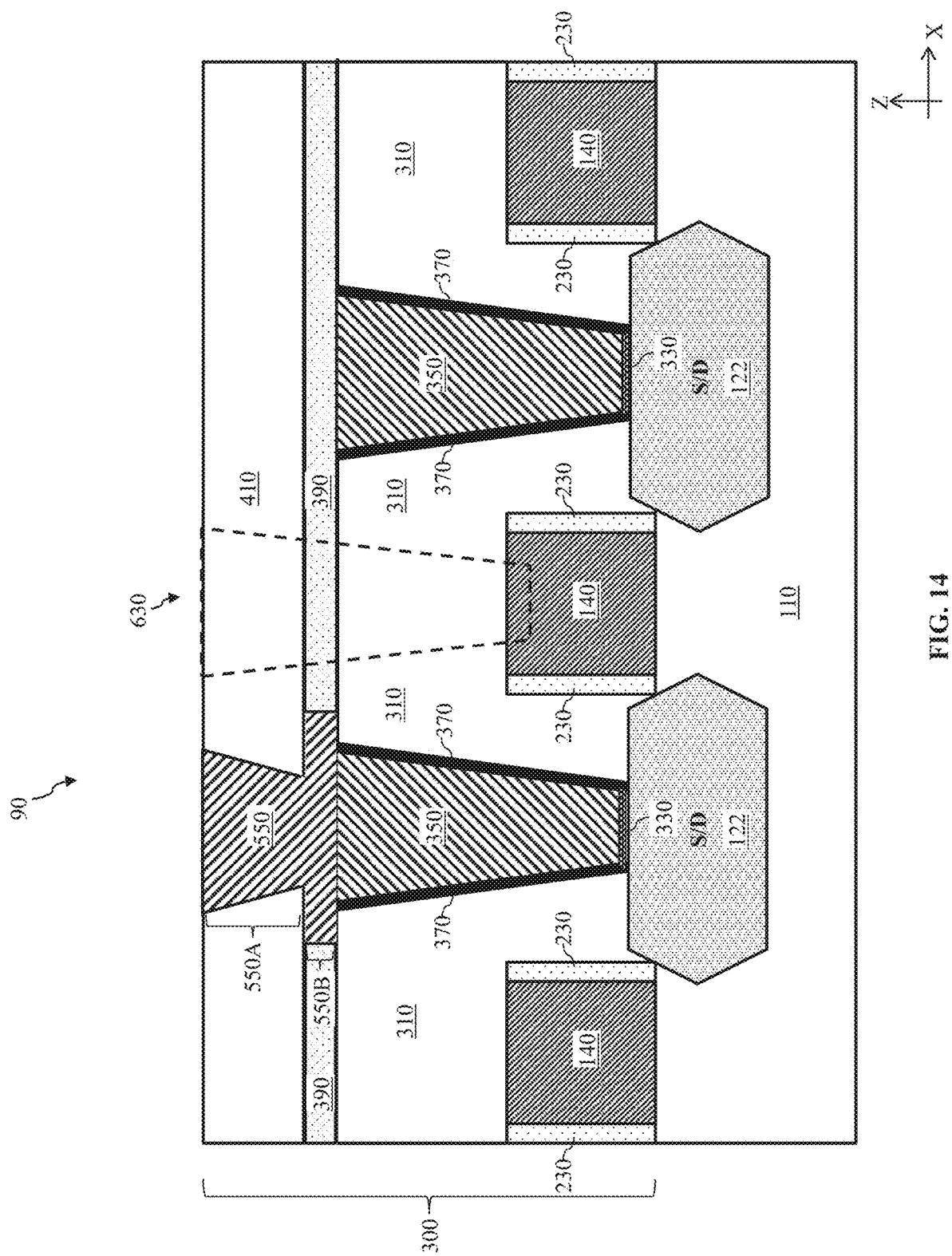
Figure 15:
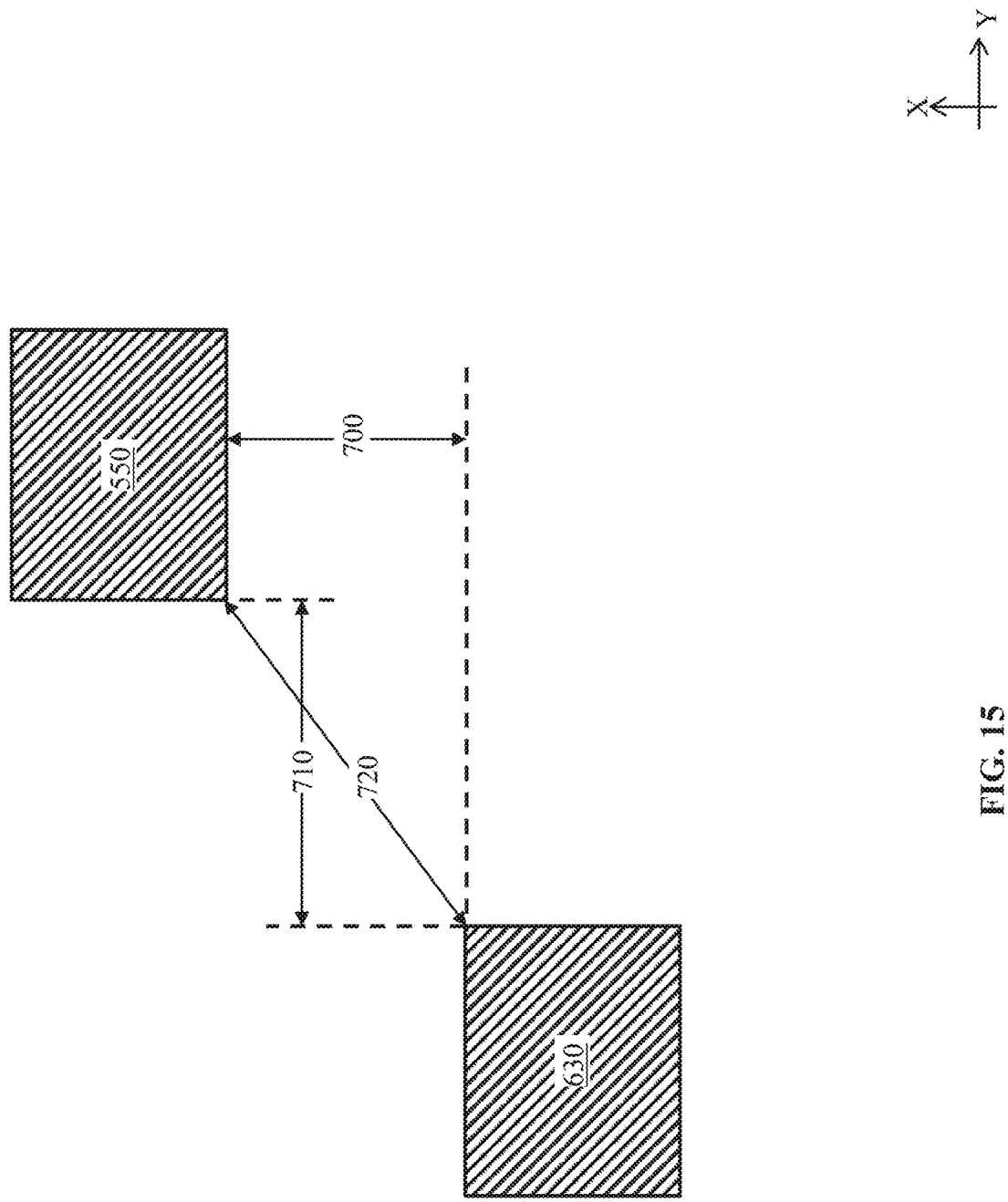
FIG. 15 is a top view of an embodiment of an IC device at a stage of fabrication according to various aspects of the present disclosure.

Referring now to FIGS. 14-15, the source/drain via 550 is still formed using the same fabrication processes discussed above. However, the source/drain via 550 and the gate via 630 are offset (or misaligned) with respect to one another in both the X-direction and the Y-direction. As shown in FIG. 14, due to such a locational offset, the gate via 630 may not be directly visible, since the cross-sectional cut along the X-Z plane that cuts into the source/drain via 550 will not cut into the gate via 630. For ease of reference, however, the outlines or contours of the gate via 630 may be shown in FIG. 14 as broken lines. Of course, if the cross-sectional cut had been taken at a different spot in the X-Z plane, the gate via 630 may be visible, but the source/drain via 550 may not be.

Referring to FIG. 15, the top view may be taken at a plane intersecting the top portion 550A of the source/drain via 550 in some embodiments, or the top view may be taken at a plane intersecting the bottom portion 550B of the source/drain via 550 in some other embodiments. In other words, the source/drain via 550 shown in FIG. 15 may correspond to the top portion 550A in some embodiments, or it may correspond to the bottom portion 550B in other embodiments.

As shown in FIG. 15, the source/drain via 550 and the gate via 630 are spaced apart from one another in the X-direction by a distance 700. The source/drain via 550 and the gate via 630 are also spaced apart from one another in the Y-direction by a distance 710. Diagonally, the source/drain via 550 and the gate via 630 may be separated by a distance 720, which may be the square root of a sum of: a square of the distance 700 and a square of the distance 710. In some embodiments, the distance 700 and 710 may each be between about two times the critical dimension (CD) and about three times the critical dimension, and the distance 720 may be between about 2.8 times the critical dimension and about 4.2 times the critical dimension. For example, the critical dimension may refer to the smallest dimension that is achievable for a feature of the IC device, for example a width of the fin structure 120 discussed above. As another example, the critical dimension may also refer to a width of the gate structure 140 discussed above. As yet another example, the critical dimension may refer to a pitch between adjacent metal lines in a metal layer.

By configuring the X-direction and Y-direction offsets (and the resulting diagonal offset) to be within such ranges, the present disclosure minimizes electrical bridging risks (e.g., electrical shorting) between the source/drain via 550 and the gate via 630. This may be particularly beneficial since the bottom portion 550B of the source/drain via 550 protrudes out laterally toward the gate via 630. As the source/drain via 550 and the gate via 630 are offset with respect to one another in not just the X-direction but also in the Y-direction, such a lateral protrusion of the source/drain via 550 still does not pose a significant risk of coming into accidental contact with the gate via 630.

Figure 16:
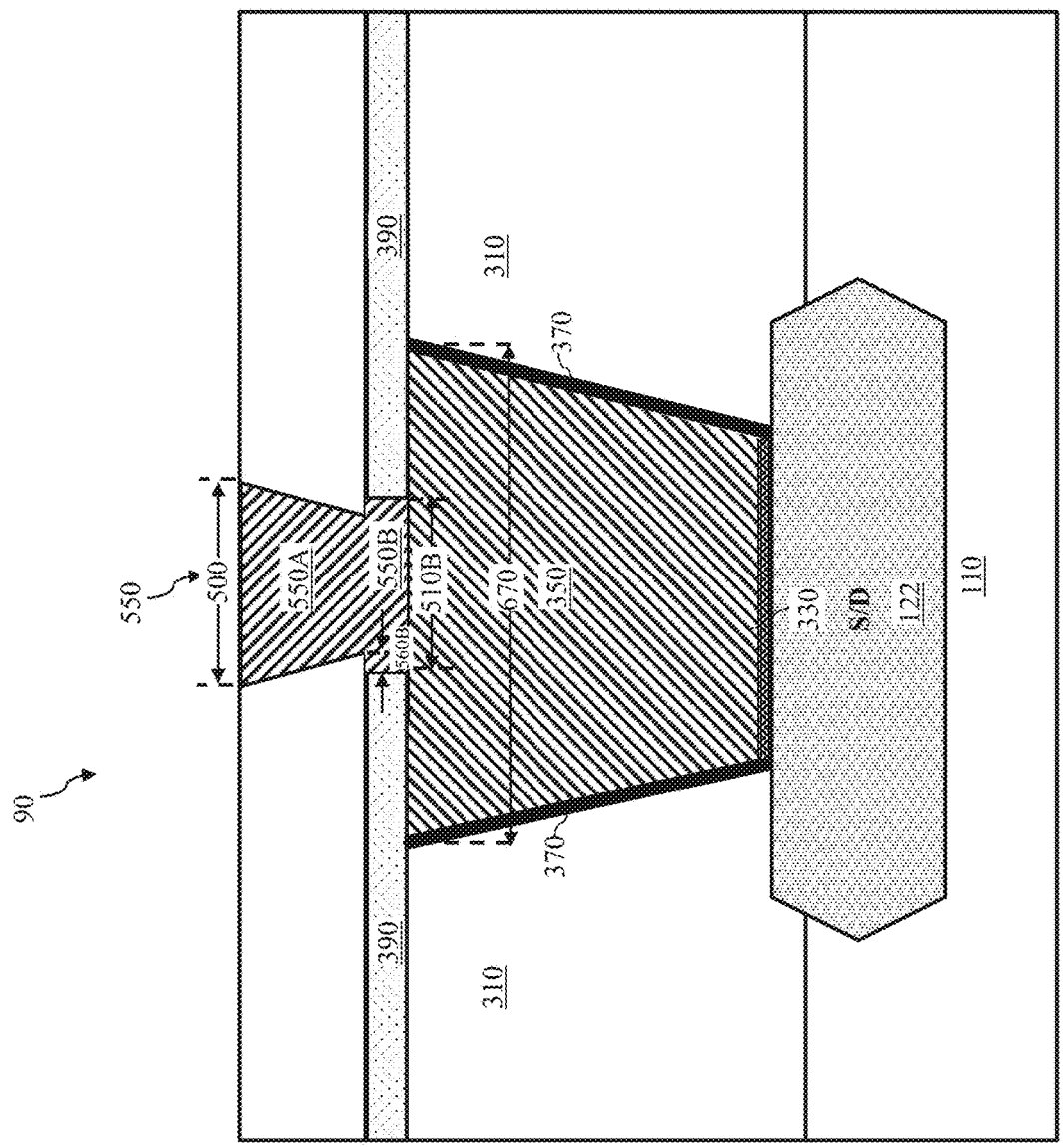
FIG. 16 is a cross-sectional view of an embodiment of an IC device at a stage of fabrication according to various aspects of the present disclosure.

FIG. 16 illustrates a cross-sectional side view of another embodiment of the device 90. For reasons of clarity and consistency, similar components appearing in the embodiments shown in FIGS. 2-14 and the embodiment shown in FIG. 16 will be labeled the same. One difference between the embodiments of FIGS. 2-14 and the embodiment of FIG. 16 is the degree or amount of the lateral protrusion of the bottom portion 550B of the source/drain via 550. In FIG. 16, the bottom portion 550B of the source/drain via 550 still protrudes laterally outward, but at a significantly smaller amount compared to the embodiments shown in FIGS. 2-14. For example, the lateral protrusion may be measured by a distance 560B, which may correspond to a distance between the sidewall of the bottom portion 550B and the bottom part of the sidewall of the top portion 550A. In some embodiments, a ratio of the distance 560B and the dimension 500 is in a range between about 1:13 and about 1:17, which is less than the ratio of the distance 560 and the dimension 500 discussed above in association with FIG. 8. Also, the bottom portion 550B has a dimension 510B in the embodiment of FIG. 16, which is less than the dimension 510 discussed above in association with FIG. 12. In some embodiments, the dimension 510B may also be less than the dimension 500 of the top portion 550A. In some embodiments, a ratio of the dimension 510B and the dimension 500 is in a range between about 1:1 and about 1:1.1.

It is also understood that the protrusion of the bottom portion 550B may not have the sharp edges as shown in FIG. 16 (or in the embodiments shown in FIGS. 12-14). Instead, the protrusion may be more gradual and more rounded. For example, the sidewall of the bottom portion 550B may be somewhat rounded or curved, rather than being a straight line. Furthermore, the top portion 550A and the bottom portion 550B may not form a sharp/acute angle, and instead the transition between the top portion 550A and the bottom portion 550B may be smoother than what is shown in FIG. 16.

Figure 17:
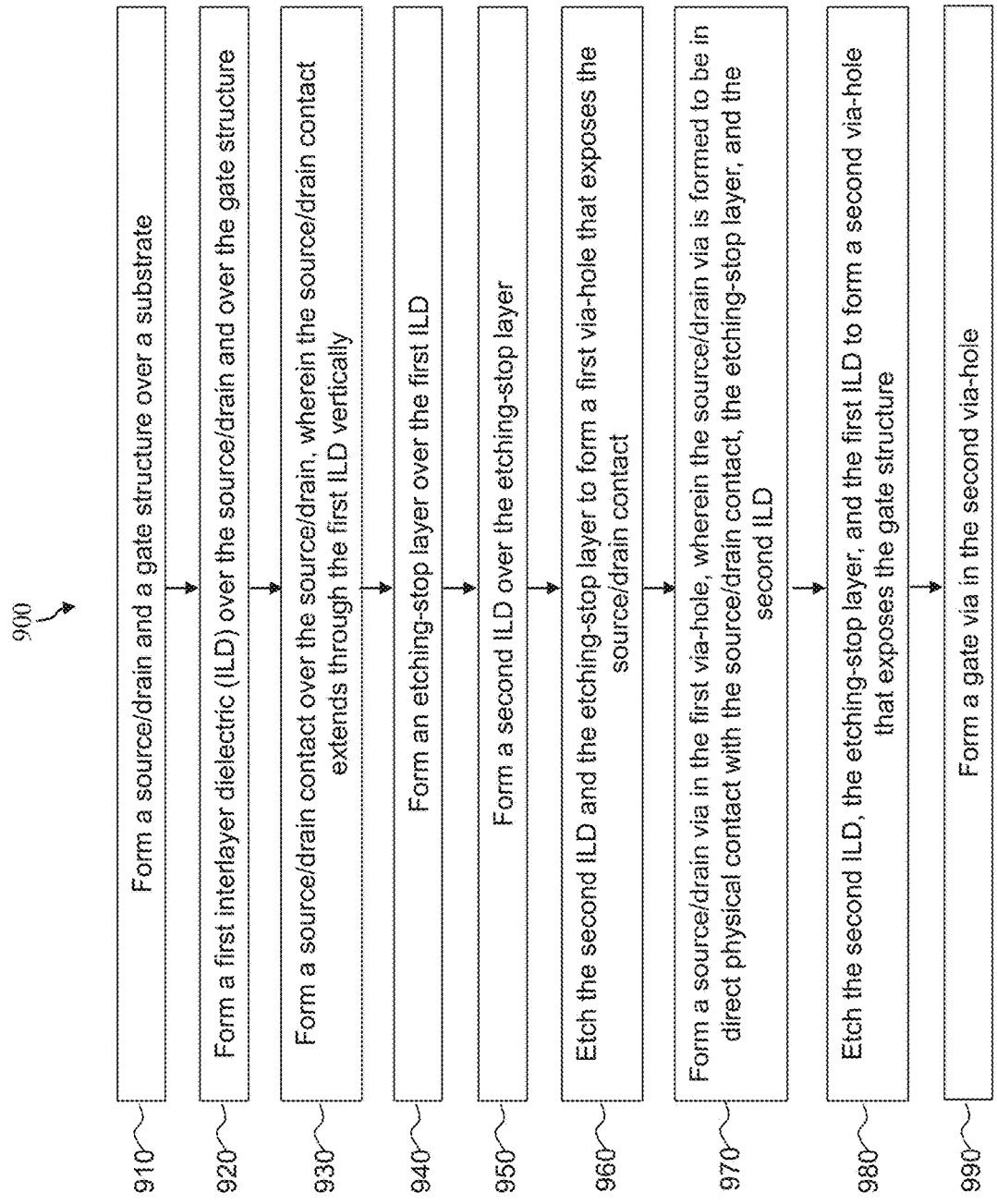
FIG. 17 is a flowchart of a method of fabricating a semiconductor device according to various aspects of the present disclosure.

FIG. 17 is a flowchart illustrating a method 900 of fabricating a semiconductor device according to another embodiment of the present disclosure. The method 900 includes a step 910 of forming a source/drain and a gate structure over a substrate.

The method 900 includes a step 920 of forming a first interlayer dielectric (ILD) over the source/drain and over the gate structure.

The method 900 includes a step 930 of forming a source/drain contact over the source/drain. The source/drain contact extends through the first ILD vertically.

The method 900 includes a step 940 of forming an etching-stop layer over the first ILD.

The method 900 includes a step 950 of forming a second ILD over the etching-stop layer.

The method 900 includes a step 960 of etching the second ILD and the etching-stop layer to form a first via-hole that exposes the source/drain contact.

The method 900 includes a step 970 of forming a source/drain via in the first via-hole. The source/drain via is formed to be in direct physical contact with the source/drain contact, the etching-stop layer, and the second ILD.

The method 900 includes a step 980 of after the forming of the source/drain via, etching the second ILD, the etching-stop layer, and the first ILD to form a second via-hole that exposes the gate structure.

The method 900 includes a step 990 of forming a gate via in the second via-hole.

In some embodiments, the etching the second ILD and the etching-stop layer is performed using one or more etching processes in which the etching-stop layer is etched at a greater etching rate than the second ILD.

In some embodiments, the forming the source/drain via is performed using a selective metal growth process.

In some embodiments, the first via-hole and the second via-hole are formed to be offset from each other in both a first lateral direction and a second lateral direction that is perpendicular to the first lateral direction.

It is understood that additional steps may be performed before, during, or after the steps 910-990. For example, after the second via-hole has been formed but before the gate via is formed, the method 900 may include a step of forming a glue layer on side surfaces of the second via-hole and over the gate structure, wherein the gate via is formed over the glue layer. As another example, after the forming the source/drain via, the method 900 may include a step of performing one or more semiconductor fabrication processes using one or more chemicals that have corrosive properties, wherein a material composition of the source/drain via is more resistant to the one or more chemicals than a material composition of the source/drain contact. Additional steps may include the formation of additional interconnect features, packaging, or testing processes.

In summary, the present disclosure involves forming a source/drain via without using glue layers. For example, the source/drain via may be grown over a source/drain contact using a selective metal growth technique. The resulting source/drain via may be formed to be in direct physical contact with the sidewalls of the adjacent dielectric layers such as the ILD layer and etching-stop layer. The present disclosure also configures the profile of the source/drain via (e.g., by etching the etching-stop layer laterally) to achieve a laterally protruding bottom portion.

Based on the above discussions, it can be seen that the present disclosure offers advantages over conventional source/drain vias. However, it is understood that not all advantages are discussed herein, different embodiments may offer different advantages, and that no particular advantage is required for any embodiment. One advantage is that the present disclosure can reduce the electrical resistance of the source/drain via. Conventional source/drain vias needed a glue layer to ensure sufficient adhesion with the nearby materials, or else the source/drain via may be inadvertently peeled off in a subsequent CMP process. However, the glue layer may have high electrical resistance, which adversely impacts the device performance. Here, the selective metal growth process obviates the need for such a glue layer, which allows the source/drain via to have reduced electrical resistance. The selective metal growth process also ensures sufficient adhesion between the source/drain via and the source/drain contact therebelow, which prevents the inadvertent peeling off of the source/drain via in CMP processes. The bottom-wide profile of the source/drain via also leads to a larger surface area, which also reduces electrical resistance. Another advantage is that the larger size of the bottom segment of the source/drain via may facilitate a more gradual transition between the source/drain contact and the source/drain via, which reduces potential fabrication related issues and/or defects. Yet another advantage is that the source/drain via and the nearby gate via may be configured to be offset from one another in both the X and Y horizontal directions. This further reduces the likelihood of electrical bridging (e.g., electrical shorting) between the source/drain via and the nearby gate via. Other advantages may include compatibility with existing fabrication processes and the ease and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor device. The semiconductor device includes: a source/drain disposed over a substrate; a source/drain contact disposed over the source/drain; and a first via disposed over the source/drain contact, wherein the first via has a laterally-protruding bottom portion and a top portion that is disposed over the laterally-protruding bottom portion.

One aspect of the present disclosure pertains to a semiconductor device. The semiconductor device includes: a source/drain disposed over a substrate; a gate structure disposed over the substrate; a first interlayer dielectric (ILD) disposed over the gate structure; an etching-stop layer disposed over the first ILD; a second ILD disposed over the etching-stop layer; a gate via disposed over the gate structure, wherein the gate via extends vertically through the first ILD, the etching-stop layer, and the second ILD; a glue layer disposed between the gate via and the first ILD, the etching-stop layer, and the second ILD; a source/drain contact disposed over the source/drain, wherein the source/drain contact extends vertically through the first ILD; and a source/drain via disposed over the source/drain contact, wherein the source/drain via extends vertically through the second ILD and the etching-stop layer, and wherein sidewalls of the source/drain via are in direct physical contact with sidewalls of the etching-stop layer and the second ILD.

Yet another aspect of the present disclosure pertains to a method of fabricating a semiconductor device. The method includes: forming a source/drain and a gate structure over a substrate; forming a first interlayer dielectric (ILD) over the source/drain and over the gate structure; forming a source/drain contact over the source/drain, wherein the source/drain contact extends through the first ILD vertically; forming an etching-stop layer over the first ILD; forming a second ILD over the etching-stop layer; etching the second ILD and the etching-stop layer to form a first via-hole that exposes the source/drain contact; forming a source/drain via in the first via-hole, wherein the source/drain via is formed to be in direct physical contact with the source/drain contact, the etching-stop layer, and the second ILD; after the forming of the source/drain via, etching the second ILD, the etching-stop layer, and the first ILD to form a second via-hole that exposes the gate structure; and forming a gate via in the second via-hole.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a source/drain disposed over a substrate;
a source/drain contact disposed over the source/drain;
a first via disposed over the source/drain contact, wherein the first via has a laterally-protruding bottom portion and a top portion that is disposed over the laterally-protruding bottom portion, and wherein the top portion has tapered sidewalls in a cross-sectional side view;
a first interlayer dielectric (ILD) disposed over the substrate, wherein the first ILD at least partially surrounds the source/drain contact laterally;
an etching-stop layer disposed over the first ILD, wherein the laterally-protruding bottom portion is disposed in the etching-stop layer; and
a second ILD disposed over the etching-stop layer, wherein the top portion is disposed in the second ILD.

2. The device of claim 1, further comprising:
a gate structure disposed over the substrate; and
a second via disposed over the gate structure, wherein the first via and the second via have substantially co-planar upper surfaces.

3. The device of claim 2, wherein the first via and the second via are offset with respect to one another in both an X-direction and a Y-direction in a top view.

4. The device of claim 2, further comprising: a glue layer disposed on side surfaces and a bottom surface of the second via.

5. The device of claim 4, wherein the glue layer contains titanium or titanium nitride.

6. The device of claim 1, wherein a first maximum lateral dimension of the laterally-protruding bottom portion is greater than a second maximum lateral dimension of the top portion.

7. The device of claim 1, wherein the source/drain contact and the first via have different metal material compositions.

8. The device of claim 1, wherein an uppermost surface of the source/drain contact is narrower than a bottommost surface of the first via.

9. The device of claim 1, wherein the laterally-protruding bottom portion is in direct contact with the source/drain contact.

10. The device of claim 1, wherein:
the tapered sidewalls are first sidewalls;
the laterally-protruding bottom portion has second sidewalls in the cross-sectional side view; and
the first sidewalls are more tapered than the second sidewalls in the cross-sectional side view.

11. A device, comprising:
a source/drain disposed over a substrate;
a gate structure disposed over the substrate;
a first interlayer dielectric (ILD) disposed over the gate structure;
an etching-stop layer disposed over the first ILD;
a second ILD disposed over the etching-stop layer;
a gate via disposed over the gate structure, wherein the gate via extends vertically through the first ILD, the etching-stop layer, and the second ILD;
a glue layer disposed between the gate via and the first ILD, the etching-stop layer, and the second ILD;
a source/drain contact disposed over the source/drain, wherein the source/drain contact extends vertically through the first ILD; and
a source/drain via disposed over the source/drain contact, wherein the source/drain via extends vertically through the second ILD and the etching-stop layer, wherein an uppermost surface of the gate via is co-planar with an uppermost surface of the source/drain via, and wherein a bottommost surface of the source/drain via is wider than the uppermost surface of the source/drain via;
wherein:
sidewalls of a bottom segment of the source/drain via are in direct physical contact with sidewalls of the etching-stop layer;
sidewalls of a top segment of the source/drain via are in direct physical contact with sidewalls of the second ILD; and
the bottom segment and the top segment have substantially different shapes in a cross-sectional side view.

12. The device of claim 11, wherein:
the bottom segment is substantially wider than the source/drain contact; and
the sidewalls of the top segment are more tapered than the sidewalls of the bottom segment.

13. The device of claim 11, wherein the source/drain via and the gate via are offset from each other in both a first horizontal direction and a second horizontal direction that is perpendicular to the first horizontal direction in a top view.

14. The device of claim 11, wherein the glue layer contains titanium or titanium nitride.

15. A device, comprising:
a source/drain disposed over a substrate;
a source/drain contact disposed over the source/drain; and
a source/drain via disposed over the source/drain contact, wherein the source/drain via has a laterally-protruding bottom portion and a top portion that is disposed over the laterally-protruding bottom portion, wherein side surfaces of the top portion have a slanted profile in a cross-sectional side view, and wherein a bottom surface of the laterally-protruding bottom portion is wider than a top surface of the top portion in the cross-sectional side view;
a first interlayer dielectric (ILD) disposed over the substrate, wherein the first ILD at least partially surrounds the source/drain contact laterally;
an etching-stop layer disposed over the first ILD, wherein the laterally-protruding bottom portion is located within the etching-stop layer; and
a second ILD disposed over the etching-stop layer, wherein the top portion is located within the second ILD.

16. The device of claim 15, further comprising:
a gate structure disposed over the substrate; and
a gate via disposed over the gate structure, wherein the gate via and the source/drain via have substantially co-planar upper surfaces, wherein the source/drain via and the gate via are separated from one another in both a first horizontal direction and a second horizontal direction in a top view.

17. The device of claim 16, further comprising: a glue layer disposed on side surfaces and a bottom surface of the gate via, wherein the glue layer contains titanium or titanium nitride.

18. The device of claim 15, wherein:
the source/drain contact and the source/drain via have different material compositions; and
an uppermost surface of the source/drain contact is wider than the bottom surface of the laterally-protruding bottom portion of the source/drain via.

19. The device of claim 15, wherein a bottom surface of the source/drain via is in direct contact with a top surface of the source/drain contact.

20. The device of claim 15, wherein the top portion of the source/drain via is more slanted than the laterally-protruding bottom portion of the source/drain via in the cross-sectional side view.

* * * * *